United States Patent
Chen

(10) Patent No.: US 11,289,130 B2
(45) Date of Patent: Mar. 29, 2022

(54) MEMORY DEVICE

(71) Applicant: MACRONIX INTERNATIONAL CO., LTD., Hsinchu (TW)

(72) Inventor: Shih-Hung Chen, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 13 days.

(21) Appl. No.: 16/997,986

(22) Filed: Aug. 20, 2020

(65) Prior Publication Data

US 2022/0059136 A1 Feb. 24, 2022

(51) Int. Cl.
| | |
|---|---|
| H01L 23/538 | (2006.01) |
| G11C 5/06 | (2006.01) |
| G11C 5/02 | (2006.01) |
| H01L 25/065 | (2006.01) |

(52) U.S. Cl.
CPC ................ G11C 5/06 (2013.01); G11C 5/025 (2013.01); H01L 23/5386 (2013.01); H01L 25/0657 (2013.01)

(58) Field of Classification Search
CPC ....... G11C 5/06; G11C 5/025; H01L 23/5386; H01L 25/0657
See application file for complete search history.

(56) References Cited

U.S. PATENT DOCUMENTS

| | | | |
|---|---|---|---|
| 8,068,365 B2 | 11/2011 | Kim | |
| 8,987,787 B2 | 3/2015 | Chen et al. | |
| 9,047,953 B2 | 6/2015 | Chen | |
| 9,240,405 B2 | 1/2016 | Chen et al. | |
| 9,564,419 B2 | 2/2017 | Chen | |
| 10,651,187 B2 | 5/2020 | Liu | |
| 10,762,965 B2 | 9/2020 | Huo et al. | |
| 10,861,826 B2 * | 12/2020 | Oh | ........ H01L 23/5385 |
| 10,910,347 B2 * | 2/2021 | She | ........... H01L 24/33 |
| 11,133,290 B2 * | 9/2021 | Zeng | .................. H01L 23/5384 |
| 2006/0125072 A1 | 6/2006 | Mihara | |
| 2007/0152313 A1 | 7/2007 | Periaman et al. | |
| 2008/0153200 A1 | 6/2008 | Sitaram | |
| 2009/0230376 A1 | 9/2009 | Ryoo et al. | |
| 2009/0243115 A1 | 10/2009 | Lee et al. | |

(Continued)

FOREIGN PATENT DOCUMENTS

| | | |
|---|---|---|
| CN | 111164752 A | 5/2020 |
| JP | H04199570 A | 7/1992 |

(Continued)

*Primary Examiner* — Nicholas J Tobergte

(74) *Attorney, Agent, or Firm* — McClure, Qualey & Rodack, LLP

(57) ABSTRACT

A memory device includes a periphery wafer, a memory array chip stack, and a plurality of first conductive contacts. The periphery wafer has a functional surface. The memory array chip stack is disposed on the periphery wafer and has a functional surface, in which the functional surface of the periphery wafer faces toward the functional surface of the memory array chip stack, and a first side of the memory array chip stack is in a staircase configuration. The first conductive contacts are on the first side of the memory array chip stack, and between and interconnecting the functional surface of the periphery wafer and the functional surface of the memory array chip stack.

18 Claims, 24 Drawing Sheets

(56) References Cited

U.S. PATENT DOCUMENTS

| | | |
|---|---|---|
| 2009/0302448 A1 | 12/2009 | Huang |
| 2010/0193930 A1* | 8/2010 | Lee ................... H01L 23/5389 |
| | | 257/686 |
| 2012/0032340 A1 | 2/2012 | Choi et al. |
| 2012/0184646 A1 | 7/2012 | Sumita et al. |
| 2013/0147063 A1* | 6/2013 | Park ................... H01L 25/0652 |
| | | 257/777 |
| 2019/0341372 A1* | 11/2019 | She ................... H01L 24/73 |
| 2019/0341399 A1 | 11/2019 | Tao et al. |
| 2020/0294918 A1 | 9/2020 | Nishida |

FOREIGN PATENT DOCUMENTS

| | | |
|---|---|---|
| JP | H05243482 A | 9/1993 |
| JP | 2002368141 A | 12/2002 |
| TW | 201232701 A | 8/2012 |
| TW | 202011576 A | 3/2020 |
| TW | 202011578 A | 3/2020 |
| TW | 202029480 A | 8/2020 |
| WO | 2019212623 A1 | 11/2019 |
| WO | 2020124877 A1 | 6/2020 |
| WO | 2020139424 A1 | 7/2020 |

* cited by examiner

MEMORY DEVICE

BACKGROUND

Field of Invention

The present disclosure relates to a memory device.

Description of Related Art

In recent years, the structures of semiconductor devices have been changed constantly, and the storage capacity of the devices has been increased continuously. Memory devices are used in storage elements for many products such as MP3 players, digital cameras, computer files, etc. As the application increases, the demand for the memory device focuses on small size and large memory capacity. For satisfying the requirement, a memory device having a high element density and a small size and the manufacturing method thereof are in need.

SUMMARY

The disclosure relates in general to a memory device.

According to some embodiments of the present disclosure, the memory device includes a periphery wafer, a memory array chip stack, and a plurality of first conductive contacts. The periphery wafer has a functional surface. The memory array chip stack is disposed on the periphery wafer and has a functional surface, in which the functional surface of the periphery wafer faces toward the functional surface of the memory array chip stack, and a first side of the memory array chip stack is in a staircase configuration. The first conductive contacts are on the first side of the memory array chip stack, and between and interconnecting the functional surface of the periphery wafer and the functional surface of the memory array chip stack.

In some embodiments of the present disclosure, a second side of the memory array chip stack is in a staircase configuration, and the second side is adjacent the first side of the memory array chip stack.

In some embodiments of the present disclosure, the memory device further includes a plurality of second conductive contacts on the second side of the memory array chip stack, and between and interconnecting the functional surface of the periphery wafer and the functional surface of the memory array chip stack.

In some embodiments of the present disclosure, a total number of the first conductive contacts and the second conductive contacts is in a range from about 100,000 to about 100,000,000.

In some embodiments of the present disclosure, a third side opposite to the first side of the memory array chip stack is in an inverted staircase configuration.

In some embodiments of the present disclosure, the memory array chip stack includes a plurality of memory array chips vertically stacked in a face-to-bottom manner.

In some embodiments of the present disclosure, the memory array chip stack includes at least four of the memory array chips.

In some embodiments of the present disclosure, a thickness of each of the memory array chips is in a range from about 1 µm to about 50 µm.

In some embodiments of the present disclosure, the memory array chips are of a same size.

In some embodiments of the present disclosure, the memory device further includes a plurality of dielectric layers laterally interposed between the memory array chips.

In some embodiments of the present disclosure, each of the memory array chips is exposed by the adjacent one of the memory array chips at the first side of the memory array chip stack by the same interval.

In some embodiments of the present disclosure, a length and a width of the periphery wafer are respectively larger than a length and a width of the memory array chip stack.

In some embodiments of the present disclosure, a length and a width of each of the first conductive contacts are in a range from about 0.1 µm to about 2 µm.

In some embodiments of the present disclosure, the memory device further includes a plurality of third conductive contacts on the functional surface of the periphery wafer and surrounding the memory array chip stack.

In some embodiments of the present disclosure, a top surface of each of the third conductive contacts is higher than or substantially coplanar with a top surface of the memory array chip stack.

In some embodiments of the present disclosure, the memory device further includes a first dielectric layer laterally extending over the periphery wafer and surrounding the memory array chip stack and the first conductive contacts.

In some embodiments of the present disclosure, the memory device further includes a second dielectric layer laterally extending over the first dielectric layer and covering the memory array chip stack.

In some embodiments of the present disclosure, an interface is between the first dielectric layer and the second dielectric layer.

In some embodiments of the present disclosure, the first dielectric layer and the second dielectric layer are formed as a single piece without an interface therebetween.

In some embodiments of the present disclosure, a fourth side opposite to the second side of the memory array chip stack is in an inverted staircase configuration.

In the aforementioned embodiments of the present disclosure, since a first side of the memory array chip stack is in a staircase configuration, a large number of the first conductive contacts can be formed on the first side and between the periphery wafer and the memory array chip stack. Therefore, a high-density and high-speed memory device can be formed accordingly. In addition, since the memory array chip stack is disposed on the periphery wafer instead of being laterally adjacent the periphery wafer, the conductive patterns on the memory array chip stack and the conductive patterns on the periphery wafer can be manufactured separately. Accordingly, the optimized conditions of the manufacturing process (e.g., the thermal cycle) can be tuned respectively for the memory array chip stack and the periphery wafer, such that the manufacturing process for the memory array chip stack and the periphery wafer may not interference with each other.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1A:
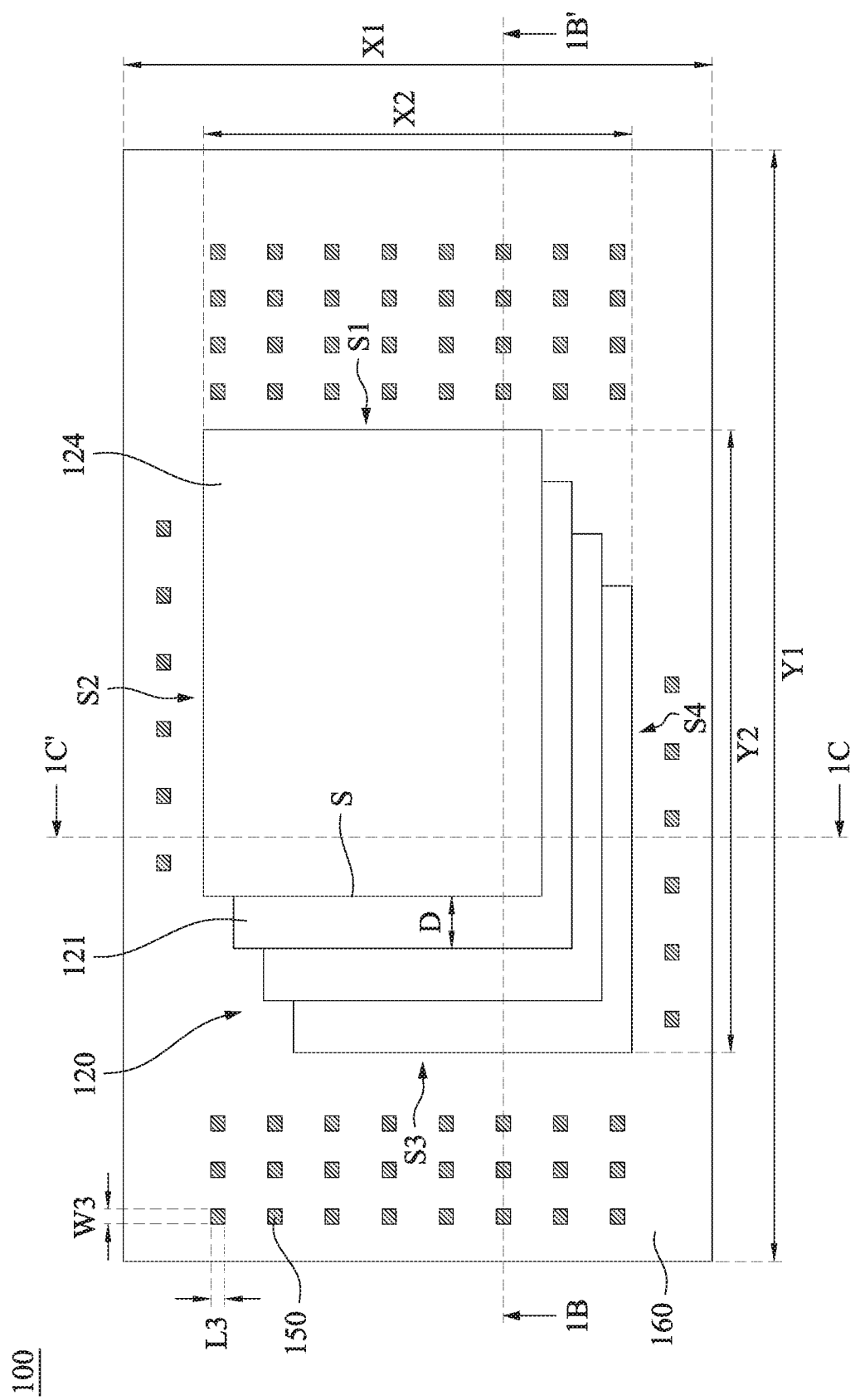
FIG. 1A is a top view illustrating a memory device according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

As used herein, "around", "about", "approximately", or "substantially" shall generally mean within 20 percent, or within 10 percent, or within 5 percent of a given value or range. Numerical quantities given herein are approximated, meaning that the term "around", "about", "approximately", or "substantially" can be inferred if not expressly stated.

Figure 1B:
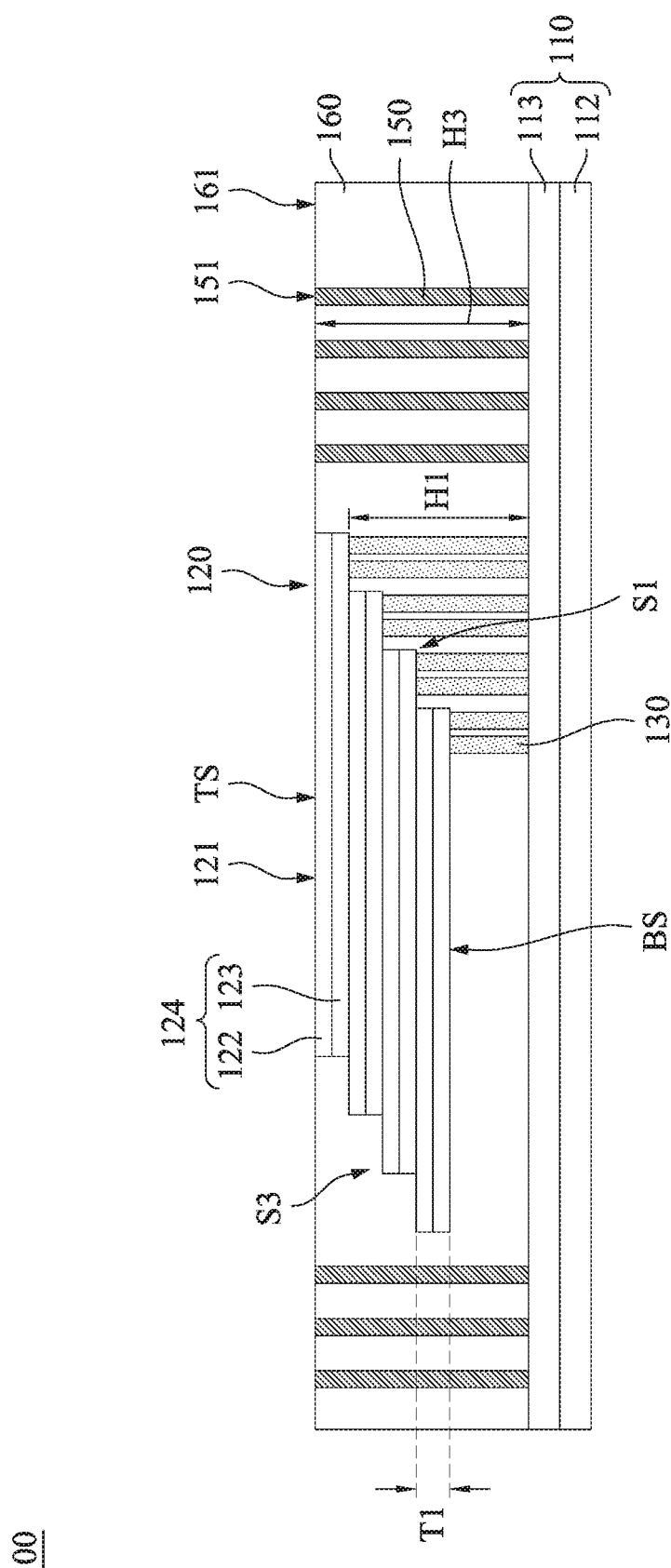
FIG. 1B is a cross-sectional view illustrating the memory device of FIG. 1 along line 1B-1B' according to some embodiments of the present disclosure.
Figure 1C:
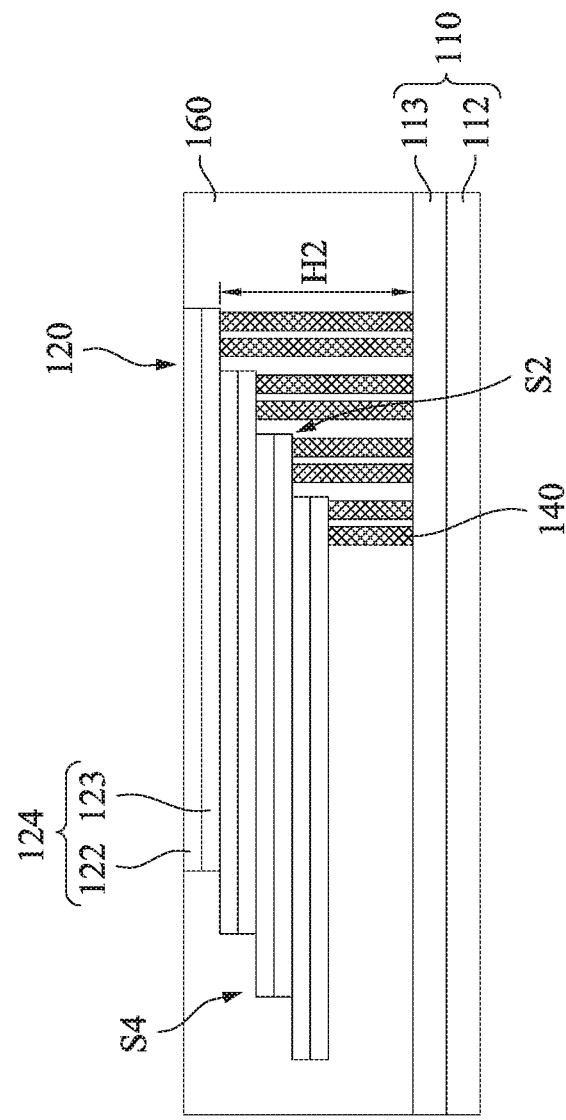
FIG. 1C is a cross-sectional view illustrating the memory device of FIG. 1 along line 1C-1C' according to some embodiments of the present disclosure.

FIG. 1A is a top view illustrating a memory device 100 according to some embodiments of the present disclosure. FIG. 1B is a cross-sectional view illustrating the memory device 100 of FIG. 1A along line 1B-1B' according to some embodiments of the present disclosure. FIG. 1C is a cross-sectional view illustrating the memory device 100 of FIG. 1A along line 1C-1C' according to some embodiments of the present disclosure. Reference is made to FIG. 1A to FIG. 1C. The memory device 100 includes a periphery wafer 110 and a memory array chip stack 120 disposed above the periphery wafer 110. The periphery wafer 110 includes a silicon substrate 112 having a functional surface 113 thereon. The memory array chip stack 120 includes a plurality of memory array chips 124 vertically stacked above the periphery wafer 110, in which each of the memory array chips 124 includes a silicon substrate 122 having a functional surface 123 thereon. It is understood that the "functional surface" herein refers to a surface that has conductive patterns such as conductive traces, conductive lines or conductive layers thereon, and may be illustrated as a "functional layer" in FIG. 1B. In some embodiments, the memory array chips 124 are vertically stacked above the periphery wafer 110 in a face-to-bottom manner, such that the silicon substrate 122 of each of the memory array chips 124 faces toward the functional surface 123 of the adjacent memory array chip 124, and is directly in contact with the functional surface 123 of the adjacent memory array chip 124. In addition, the functional surfaces 123 of the memory array chips 124 are together referred to as a functional surface of the memory array chip stack 120, and the functional surface of the memory array chip stack 120 faces toward the functional surface 113 of the periphery wafer 110.

In the present disclosure, the periphery wafer includes periphery circuits for the memory array chip, or the control logics for the memory array chip. The control logics include controllers. The memory array chip includes non-volatile memory (NAND, AND, NOR, or other flash memory) or volatile memory (DRAM or SRAM).

In some embodiments, the memory array chip includes a non-volatile memory array region, and the periphery wafer includes the periphery circuits for the non-volatile memory array region.

In some other embodiments, the memory array chip includes a non-volatile memory array region and the periphery circuits for the non-volatile memory array region, and the periphery wafer includes control logics for the non-volatile memory.

In some other embodiments, the memory array chip includes DRAM or SRAM memory array region and the periphery circuits for the DRAM or SRAM memory array region, and the periphery wafer includes control logics for the DRAM or SRAM memory.

In some embodiments, the memory array chips 124 are stacked in a deviate manner, that is, each of the memory array chips 124 is stacked on the adjacent memory array chip 124 without entirely covering the adjacent memory array chip 124. For example, each of the memory array chips 124 may be in a rectangular shape, and two of the four sides of each memory array chip 124 are exposed by the adjacent memory array chip 124 from a top view, as shown in FIG. 1A. In other words, edge portions of a non-functional surface 121 (i.e., a surface of the silicon substrate 122 of the memory array chip 124 facing away from the functional surface 123) of each of the memory array chips 124 are exposed by the adjacent memory array chip 124 from a top view shown in FIG. 1A, so as to form an inverted staircase configuration. On the other hand, the other two of the four sides of each memory array chip 124 are exposed by the adjacent memory array chip 124 from a bottom view, in which FIG. 1B only shows one of the two sides of each memory array chip 124 exposed by the adjacent memory array chip 124. In other words, edge portions of the functional surface 123 of each of the memory array chips 124 are exposed by the adjacent memory array chip 124 from a bottom view, so as to form a staircase configuration.

Accordingly, as the memory array chips 124 are stacked in such a manner, the memory array chip stack 120 is formed to include four sides, in which two of the four sides of the memory array chip stack 120 are in a staircase configuration, and other two of the four sides of the memory array chip stack 120 are in an inverted staircase configuration. For example, a first side S1 and a second side S2 of the memory array chip stack 120 are in the staircase configuration, in which the first side S1 is adjacent the second side S2 of the memory array chip stack 120, and the edge portions of the functional surfaces 123 of the memory array chips 124 together form a portion of such a staircase configuration. For another example, a third side S3 and a fourth side S4 of the memory array chip stack 120 are in the inverted staircase configuration, in which the third side S3 is adjacent the fourth side S4, the third side S3 and the fourth side S4 are respectively opposite to the first side S1 and the second side S2, and the edge portions of the non-functional surfaces 121 of the memory array chips 124 together form a portion of such an inverted staircase configuration. It is understood that the four sides of the memory array chip stack 120 interconnect and are adjacent a top surface TS of the memory array chip stack 120 (i.e., the non-functional surface 121 of the topmost memory array chip 124) and a bottom surface BS of the memory array chip stack 120 (i.e., the functional surface 123 of the bottommost memory array chip 124).

In some embodiments, the periphery wafer 110 is spaced apart from the memory array chip stack 120, and the memory device 100 further includes a plurality of first conductive contacts 130 vertically disposed between the periphery wafer 110 and the memory array chip stack 120, so as to electrically connect the periphery wafer 110 and the memory array chip stack 120. For example, the first conductive contacts 130 may be disposed at the first side S1 of the memory array chip stack 120 and on the exposed edge portions of the functional surfaces 123 of the memory array chips 124, and between and interconnecting the functional surfaces 123 of the memory array chips 124 (i.e., the functional surface of the memory array chip stack 120) and the functional surface 113 of the periphery wafer 110. In some embodiments, the first conductive contacts 130 are electrically connected to word lines (WLs). In some embodiments, the memory device 100 further includes a plurality of second conductive contacts 140 vertically disposed between the periphery wafer 110 and the memory array chip stack 120, so as to electrically connect the periphery wafer 110 and the memory array chip stack 120. For example, the second conductive contacts 140 may be disposed at the second side S2 of the memory array chip stack 120 and on the exposed edge portions of the functional surfaces 123 of the memory array chips 124, and between and interconnecting the functional surfaces 123 of the memory array chips 124 and the functional surface 113 of the periphery wafer 110. In some embodiments, the second conductive contacts 140 are electrically connected to bit lines (BLs).

In some embodiments, the first conductive contacts 130 and the second conductive contacts 140 may include copper, gold, or other suitable conductive metal materials. Through the configuration of the first conductive contacts 130 and the second conductive contacts 140, electronic elements on the periphery wafer 110, such as a memory controller unit, etc., can be electrically connected to the memory array chip stack 120, so as to maintain the operation of the memory device 100. In some embodiments, a total number of the first conductive contacts 130 and the second conductive contacts 140 is in a range from about 100,000 to about 100,000,000, or preferably, in a range from about 1,000,000 to about 10,000,000. In detail, if the total number of the first conductive contacts 130 and the second conductive contacts 140 is lower than about 100,000, a high-density and high-speed memory device 100 may not be obtained; and if the total number of the first conductive contacts 130 and the second conductive contacts 140 is greater than about 100,000,000, electrical short may easily occur due to an unbearably high-density of the first conductive contacts 130 and the second conductive contacts 140. In some embodiments, a length L1, L2 and a width W1, W2 (see FIG. 3A in advance) of each of the first conductive contacts 130 and the second conductive contacts 140 are in a range from about 0.1 µm to about 2 µm. In detail, if the length L1, L2 and the W1, W2 are smaller than about 0.1 µm, the bonding of the first conductive contacts 130 (and the second conductive contacts 140) during the manufacturing process may be difficult to be controlled; and if the length L1, L2 and the W1, W2 are larger than about 2 µm, a high-density first and second conductive contacts 130, 140 and a high-speed memory device 100 may not be obtained.

In some embodiments, the memory array chip stack 120 may include at least four of the memory array chips 124 stacked above the periphery wafer 110, such that enough surface area of the functional surfaces 123 of the memory array chips 124 are exposed, and hence a large number of the first conductive contacts 130 and the second conductive contacts 140 are able to be disposed thereon. In some embodiments, each of the memory array chips 124 are of a same size (i.e., having a same length and a same width), such that the stacking of the memory array chips 124 may be simpler and stabler. In some embodiments, the edge portion of each of the memory array chips 124 at the same side (e.g., the first side S1, the second side S2, the third side S3, or the fourth side S4) is exposed by the same interval. In other words, lateral distances D between sidewalls S of the memory array chips 124 at the same side (e.g., the third side S3) may be substantially identical. For example, the lateral distance D between the sidewall S of the topmost memory array chip 124 at the third side S3 and the sidewall S of the second topmost memory array chip 124 at the third side S3 is substantially identical to the lateral distance D between the sidewall S of the second topmost memory array chip 124 at the third side S3 and the sidewall S of the third topmost memory array chip 124 at the third side S3. Accordingly, the stacking of the memory array chips 124 may be simpler and stabler.

In some embodiments, a thickness T1 of each of the memory array chips 124 is in a range from about 1 µm to about 50 µm, such that an overall thickness of the memory device 100 can be kept in a suitable range, and the stacking of the memory array chips 124 can be simpler and stabler. In detail, if the thickness T1 of each of the memory array chips 124 is smaller than about 1 µm, the memory array chips 124 may be too thin to be functionalize, and the stacking of the memory array chips 124 may be difficult due to the inconvenience for the picking-up of the memory array chips 124; and if the thickness T1 of each of the memory array chips 124 is larger than about 50 µm, the overall thickness of the memory device 100 may be too large, which is harmful to the volume reduction of the memory device 100.

In some embodiments, the memory device 100 further includes a plurality of third conductive contacts 150 vertically disposed on the functional surface 113 of the periphery wafer 110 and surrounding the memory array chip stack 120. The third conductive contacts 150 are configured to electrically connect the electronic elements on the periphery wafer 110 to the external electronic elements, such as I/O power source. In some embodiments, conductive lines or wires may further be connected from the top surfaces 151 of the third conductive contacts 150 to external electronic elements. The third conductive contacts 150 are further configured to electrically connect the first conductive contacts 130 and the second conductive contacts 140 respectively to the word lines and the bit lines. In some embodiments, the top surface 151 of each of the third conductive contacts 150 is substantially coplanar with the top surface TS of the memory array chip stack 120 (i.e., the non-functional surface 121 of the topmost memory array chip 124). In some embodiments, a height H3 of each of the third conductive contacts 150 are larger than a height H1, H2 of each of the first conductive contacts 130 and the second conductive contacts 140. In some embodiments, a length L3 and a width W3 of each of the third conductive contacts 150 are in a range from about 0.1 µm to about 2 µm. In detail, if the length L3 and the W3 are smaller than about 0.1 µm, the bonding of the third conductive contacts 150 during the manufacturing process may be difficult to be controlled; and if the length L3 and the W3 are larger than about 2 µm, a high-density third conductive contacts 150 and high-speed memory device 100 may not be obtained. In some embodiments, the third conductive contacts 150 may include copper, gold, or other suitable conductive metal materials.

In some embodiments, a length X1 and a width Y1 of the periphery wafer 110 are respectively larger than a length X2 and a width Y2 of the memory array chip stack 120, such that the third conductive contacts 150 can be formed on the functional surface 113 of the periphery wafer 110 and to surround the memory array chip stack 120. In other words, since the length X1 and the width Y1 of the periphery wafer 110 are respectively larger than the length X2 and the width Y2 of the memory array chip stack 120, spaces are preserved on the functional surface 113 of the periphery wafer 110 for the third conductive contacts 150 to be formed. In addition, since the length X1 and the width Y1 of the periphery wafer 110 are respectively larger than the length X2 and the width Y2 of the memory array chip stack 120, there is no need for a precise alignment during the bonding of the memory array chip stack 120 to the periphery wafer 110, and hence the cost of alignment can be saved. In some embodiments, the third conductive contacts 150 are arranged on the periphery wafer 110 in an array, as shown in FIG. 1A. In some embodiments, a number of the third conductive contacts 150 adjacent each side (e.g., the first side S1, the second side S2, the third side S3, or the fourth side S4) of the memory array chip stack 120 are different.

In some embodiments, the memory device 100 further includes a first dielectric layer 160 laterally extending over the periphery wafer 110 and surrounding the memory array chip stack 120. In some embodiments, the first dielectric layer 160 further surrounds the first conductive contacts 130, the second conductive contacts 140, and the third conductive contacts 150. Stated differently, the first dielectric layer 160 entirely fills in spaces between periphery wafer 110, the memory array chip stack 120, the first conductive contacts 130, the second conductive contacts 140, and the third conductive contacts 150, so as to electrically isolate the above elements. In some embodiments, a top surface 161 of the first dielectric layer 160 is substantially coplanar with the top surface TS of the memory array chip stack 120 (i.e., the non-functional surface 121 of the topmost memory array chip 124) and the top surface 151 of the third conductive contacts 150. In some embodiments, the first dielectric layer 160 may include organic materials such as polyimide. In alternative embodiments, the first dielectric layer 160 may include inorganic materials such as silicon dioxide ($SiO_2$) formed as spin-on glass (SOG).

Accordingly, since at least one side of the memory array chip stack is in a staircase configuration, a large number of the conductive contacts can be formed on the side and between the periphery wafer and the memory array chip stack. Therefore, a high-density and high-speed memory device can be formed accordingly. Furthermore, since the size (i.e., the length and width) of the periphery wafer is larger than the size of the memory array chip stack, there is no need for a precise alignment during the bonding of the memory array chip stack to the periphery wafer, and hence the cost of alignment can be saved.

FIGS. 2A, 3A, 4A, 5A, 6A, 7A are top views illustrating a process at various stages of a manufacturing method of the memory device 100 according to some embodiments of the present disclosure. FIGS. 2B-2C, 3B-3C, 4B-4C, 5B-5C, 6B-6C, 7B-7C are cross-sectional views illustrating a process at various stages of a manufacturing method of the memory device 100 according to some embodiments of the present disclosure. It is noted that the connection relationships, the materials, and the advantages of the elements described above will not be repeated. In the following description, a manufacturing method of the memory device 100 will be described.

Figure 2A:
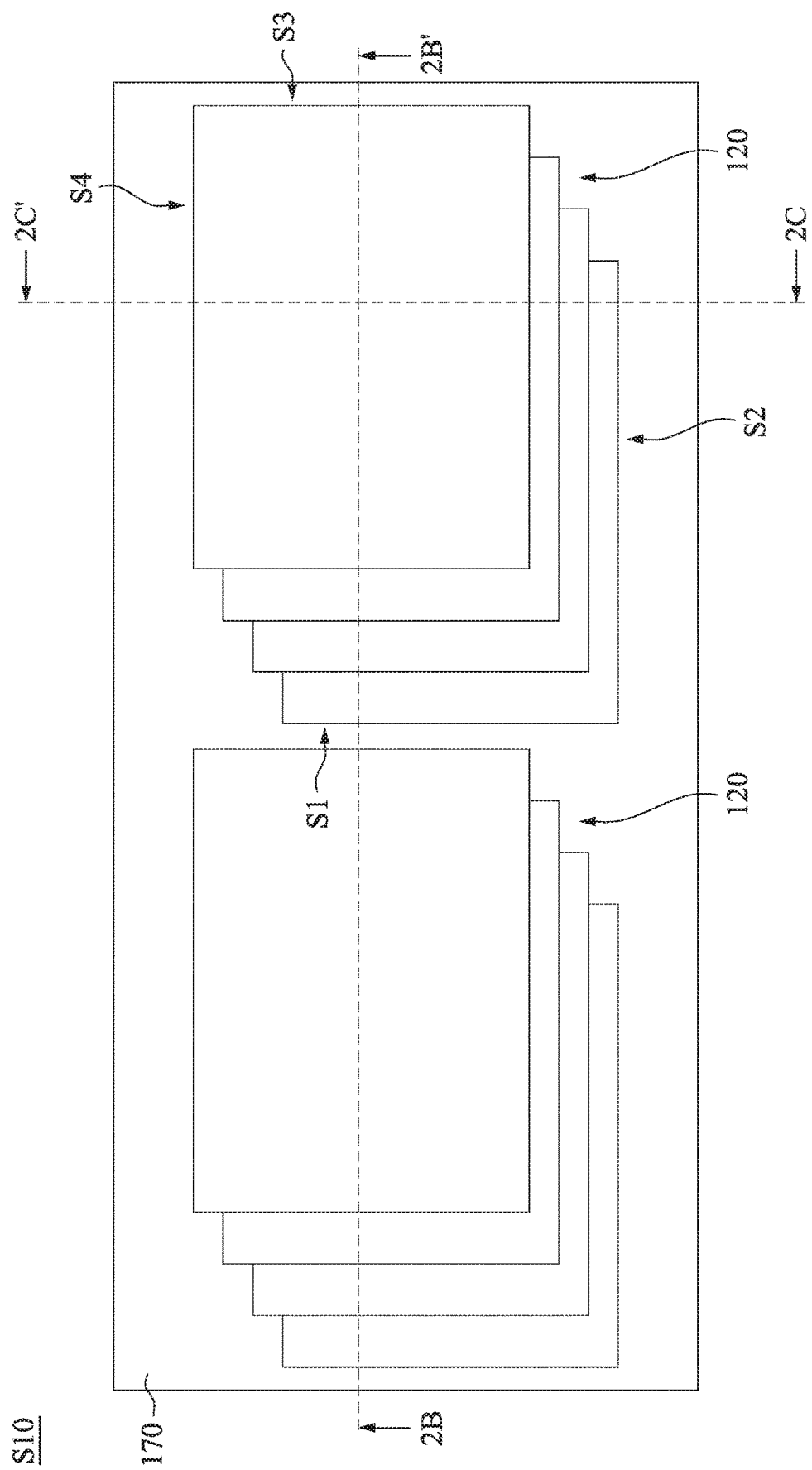
FIGS. 2A, 3A, 4A, 5A, 6A, 7A are top views illustrating a process at various stages of a manufacturing method of a memory device according to some embodiments of the present disclosure.
Figure 2B:
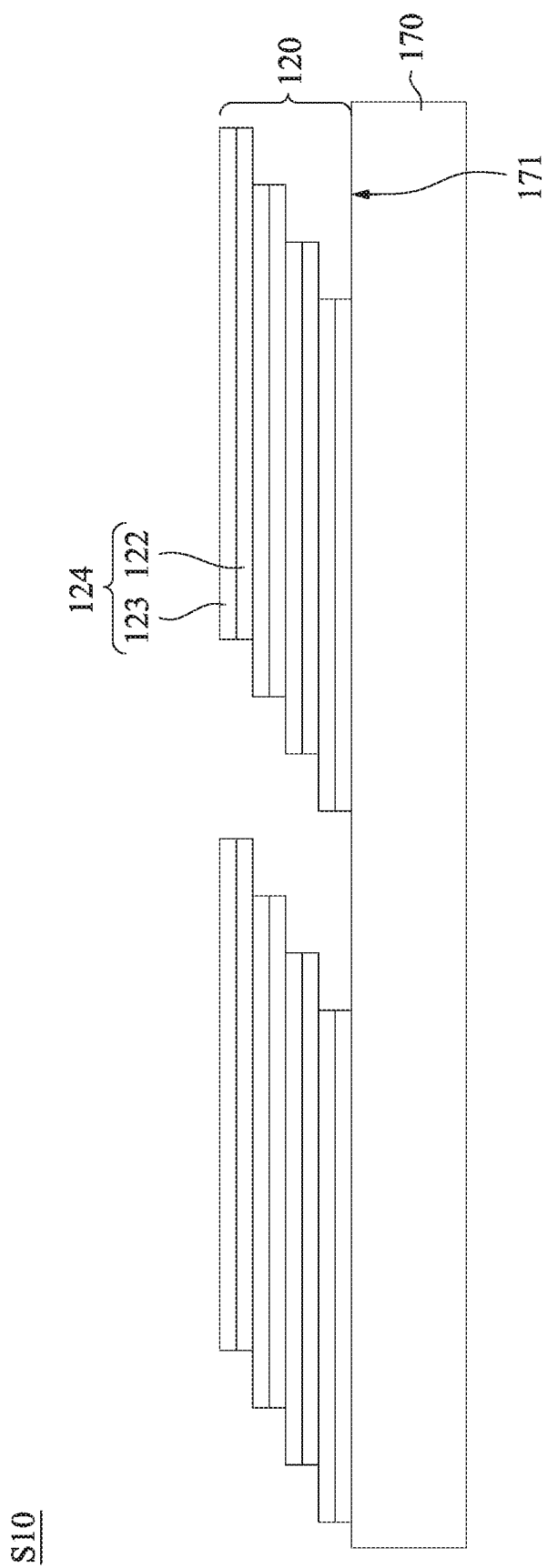
FIGS. 2B-2C, 3B-3C, 4B-4C, 5B-5C, 6B-6C, 7B-7C are cross-sectional views illustrating a process at various stages of a manufacturing method of a memory device according to some embodiments of the present disclosure.
Figure 2C:
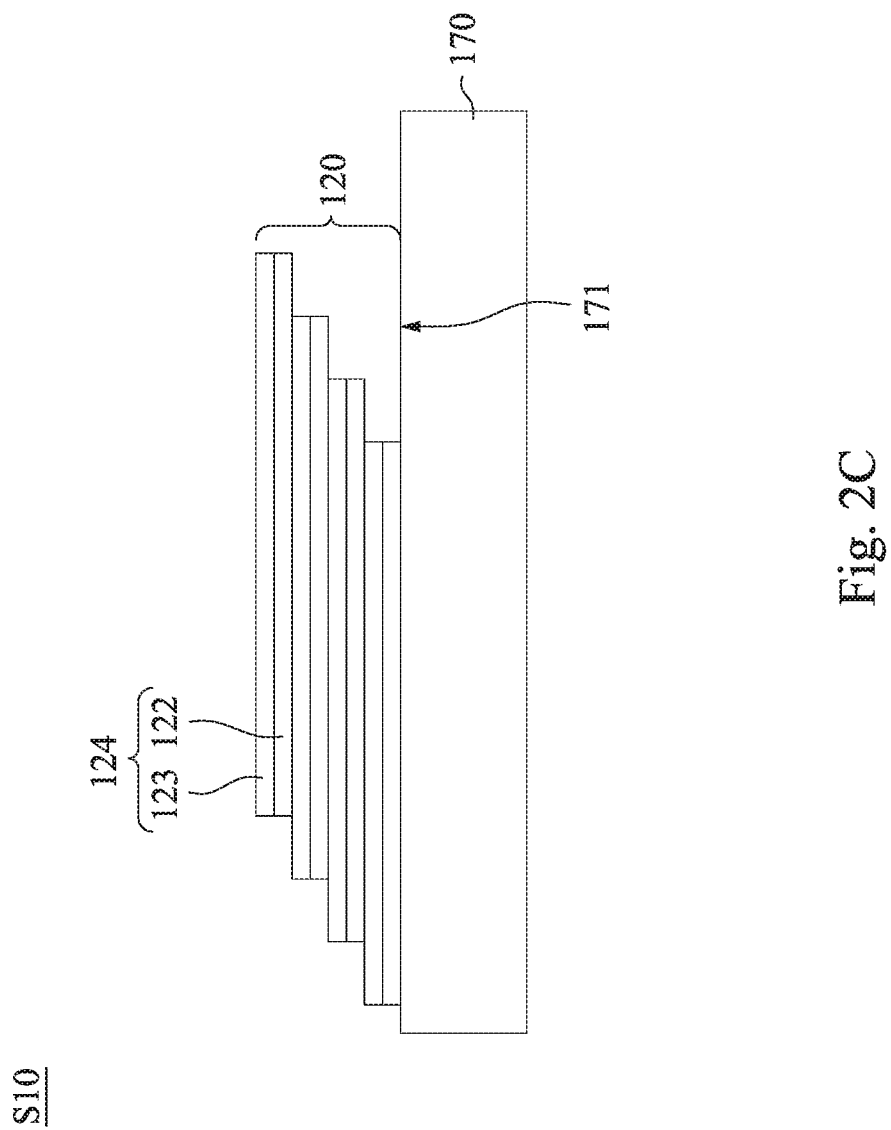

Reference is made to FIG. 2A to FIG. 2C, in which FIG. 2B is a cross-sectional view taken along line 2B-2B' shown in FIG. 2A, and FIG. 2B is a cross-sectional view taken along line 2C-2C' shown in FIG. 2A. In step S10, a carrier 170 is provided. In some embodiments, the carrier 170 may be a silicon dioxide wafer, but the present disclosure is not limited in this regard. After the carrier 170 is provided, a plurality of the memory array chips 124 are then stacked in a face-to-bottom (i.e., the silicon substrate 122 of each of the memory array chips 124 faces toward the functional surface 123 of the adjacent memory array chip 124) and deviate manner on a surface 171 of the carrier 170, so as to form a plurality of the memory array chip stacks 120 with staircase/inverted staircase configurations. For example, the first side S1 and the second side S2 of each memory array chip stack 120 are in the staircase configurations, while the third side S3 and the four side S4 of each memory array chip stack 120 are in inverted staircase configurations. In some embodiments, an orientation of each of the memory array chip stacks 120 may be substantially identical, as shown in FIG. 2A.

Figure 3A:
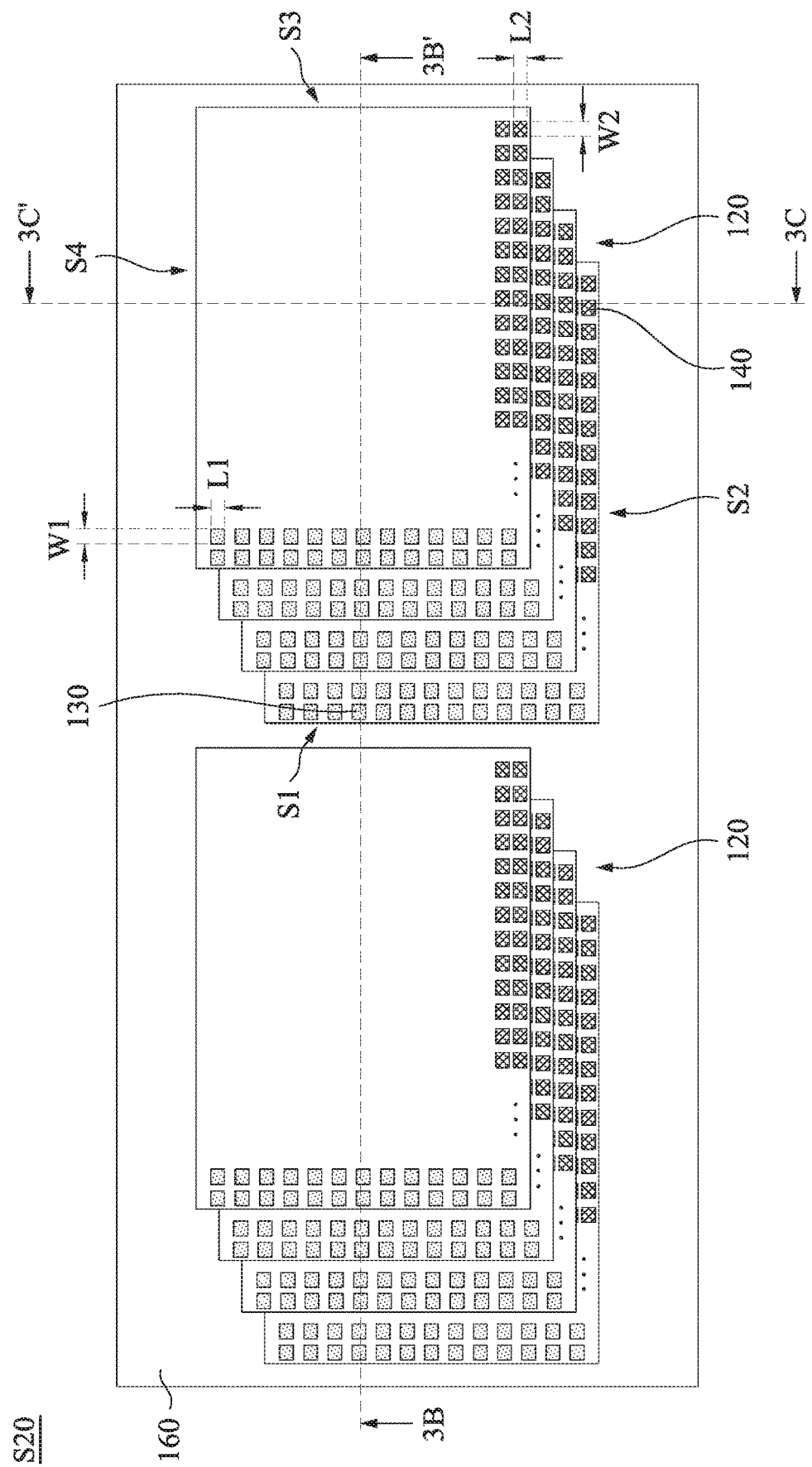
Figure 3B:
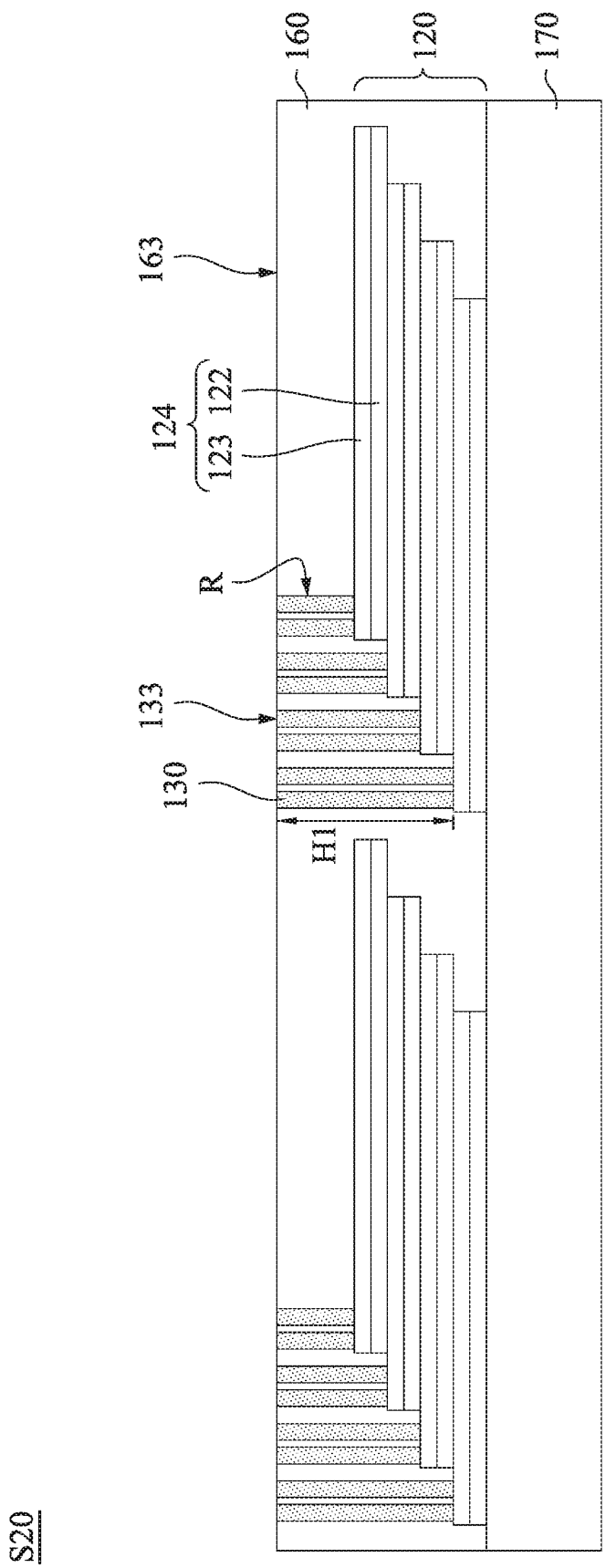
Figure 3C:
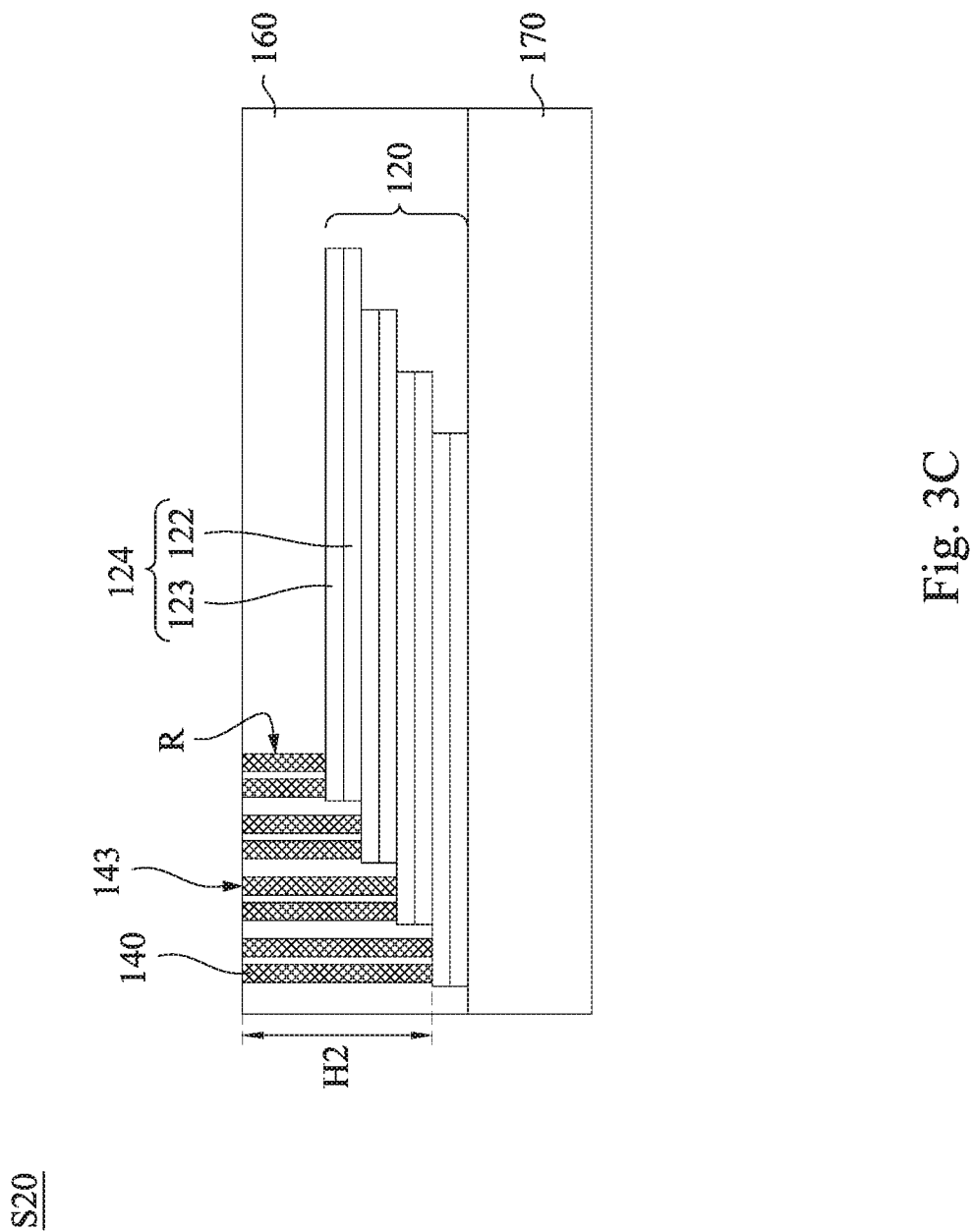

Reference is made to FIG. 3A to FIG. 3C, in which FIG. 3B is a cross-sectional view taken along line 3B-3B' shown in FIG. 3A, and FIG. 3B is a cross-sectional view taken along line 3C-3C' shown in FIG. 3A. In step S20, the first dielectric layer 160 is formed laterally extending over the carrier 170 and covering the memory array chip stacks 120. After the first dielectric layer 160 is formed, the first conductive contacts 130 and the second conductive contacts 140 are then formed within the first dielectric layer 160 and on portions of the functional surface of each memory array chip stack 120 at the first side S1 and the second side S2. In some embodiments, the first conductive contacts 130 and the second conductive contacts 140 are formed by removing portions of the first dielectric layer 160 to form recesses R exposing portions of the functional surface 123 of each memory array chip stack 120 followed by filling a conductive material in the recess R. In some embodiments, the removal of the portions of the first dielectric layer 160 may be performed by a dry or wet etching process. In some embodiments, a hard mask (not shown) may be formed over portions of the first dielectric layer 160 during the etching process, so as to remove the exposed portions of the first dielectric layer 160 not being covered by the hard mask. In addition, a planarization process, such as a CMP process, may be performed to remove excess portions of the conductive material and the first dielectric layer 160, such that a top surface 163 of the first dielectric layer 160 (which will be the bottom surface 163 of the first dielectric layer 160 after the memory device 100 is formed) is substantially coplanar with top surfaces 133 of the first conductive contacts 130 (which will be bottom surfaces 133 of the first conductive contacts 130 after the memory device 100 is formed) and top surfaces 143 of the second conductive contacts 140 (which will be bottom surfaces 143 of the second conductive contacts 140 after the memory device 100 is formed).

In some embodiments, the height H1, H2 of the first conductive contacts 130 and the second conductive contacts 140 formed on different memory array chips 124 may be different, in which the first conductive contacts 130 and the second conductive contacts 140 formed on the memory array chips 124 nearer the carrier 170 are larger in height H1, H2, while the first conductive contacts 130 and the second conductive contacts 140 formed on the memory array chips 124 further away from the carrier 170 are smaller in height H1, H2. In some embodiments, conductive pads (not shown) may be formed on the functional surface 123 of each memory array chip stack 120 in advance, such that the first conductive contacts 130 and the second conductive contacts 140 can be formed directly on the conductive pads to make electrical connections. In some embodiments, the conductive pads may include copper, gold, or other suitable conductive metal materials. In preferred embodiments, the conductive pads, the first conductive contacts 130, and the second conductive contacts 140 may include the same material.

Figure 4A:
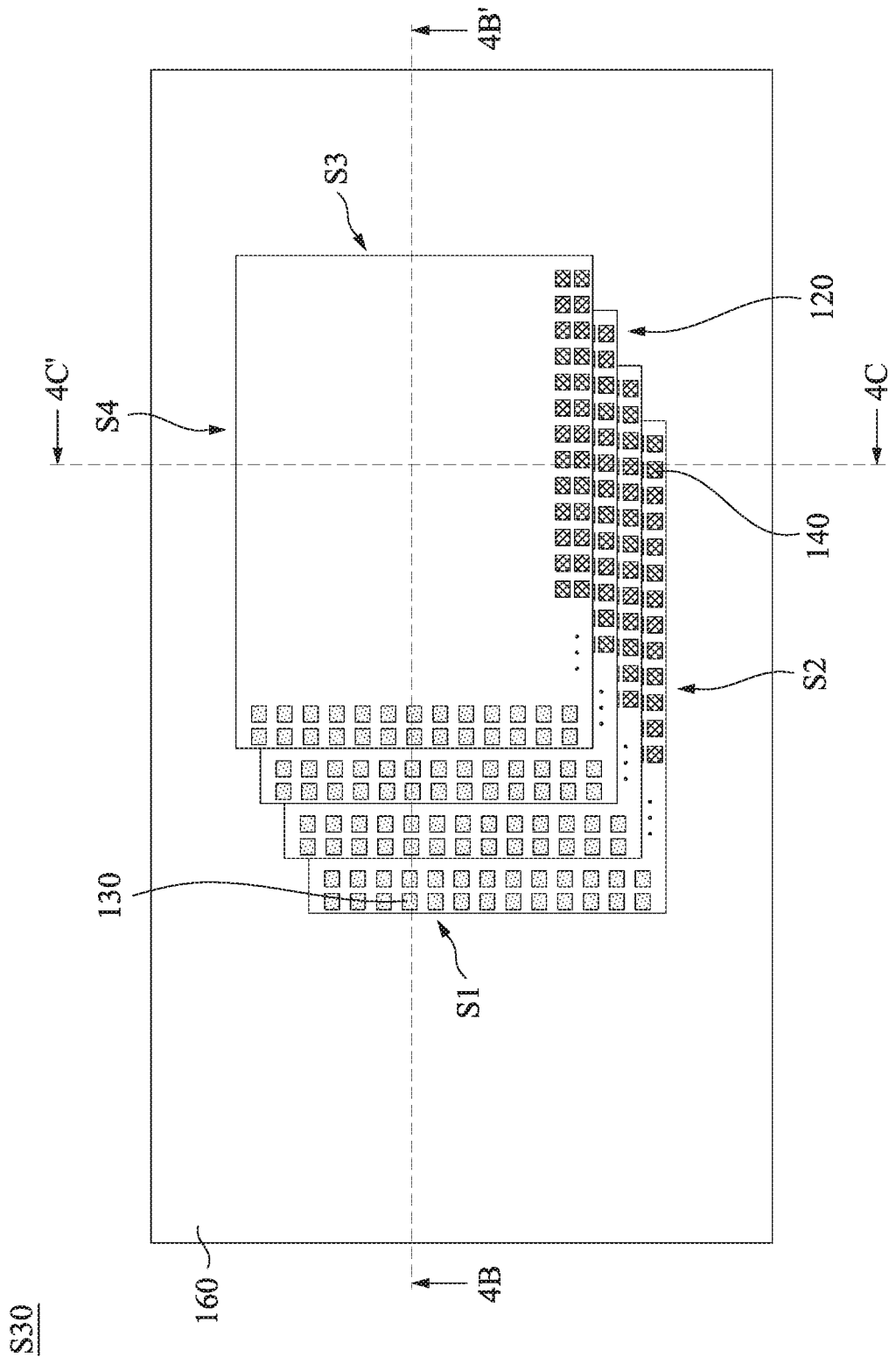
Figure 4B:
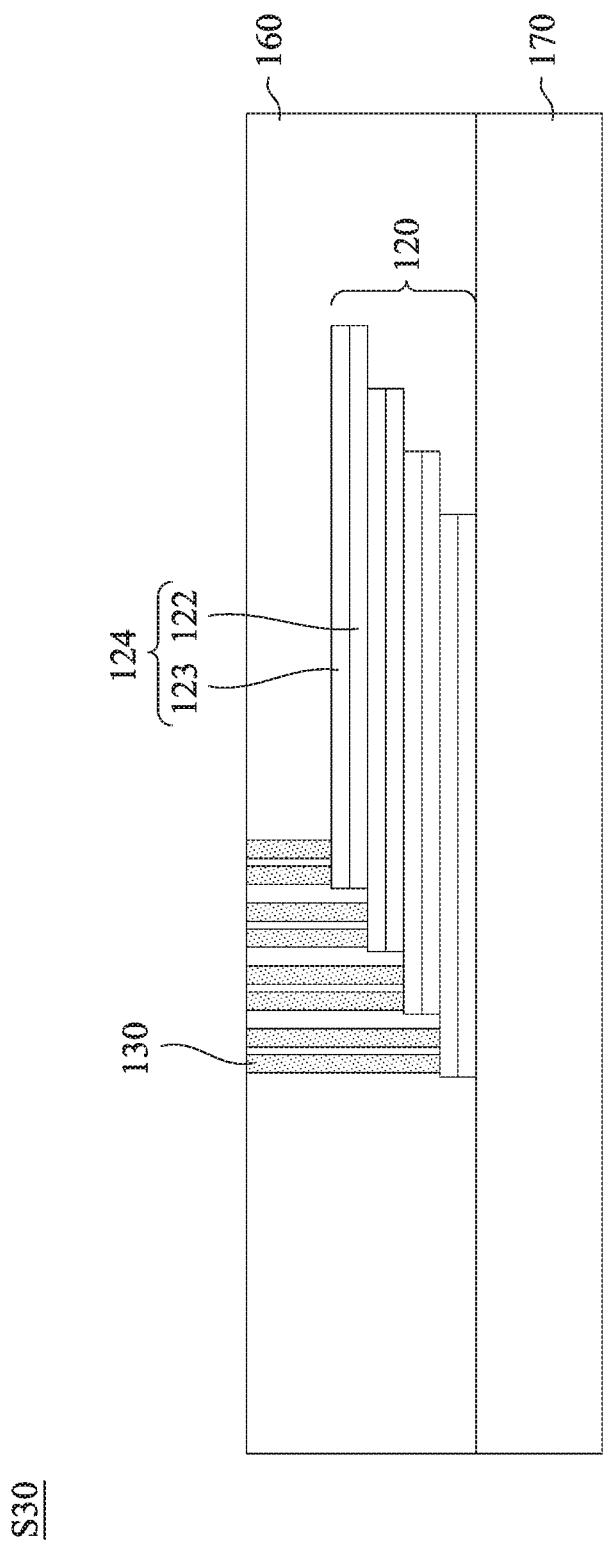
Figure 4C:
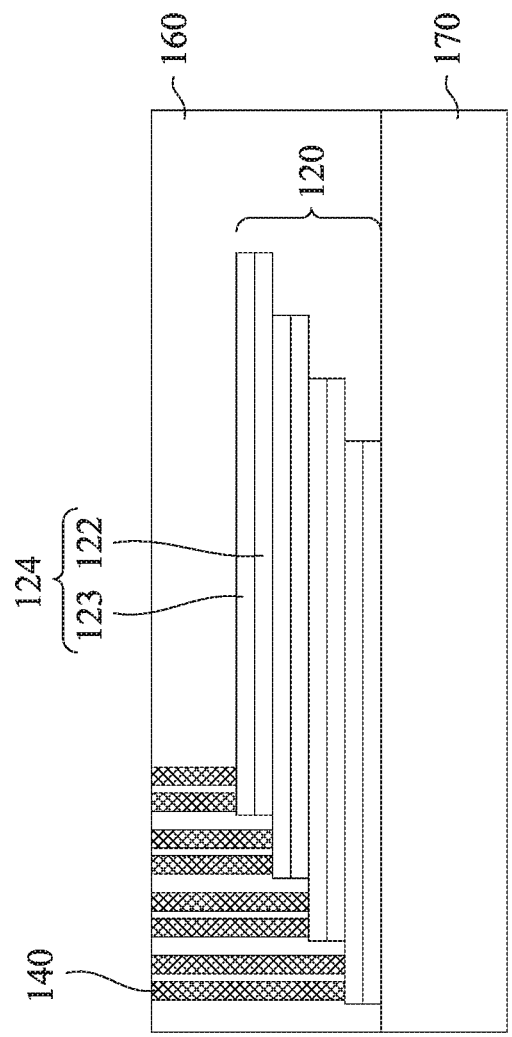

Reference is made to FIG. 4A to FIG. 4C, in which FIG. 4B is a cross-sectional view taken along line 4B-4B' shown in FIG. 4A, and FIG. 4B is a cross-sectional view taken along line 4C-4C' shown in FIG. 4A. In step S30, the structure shown in FIG. 3A to FIG. 3C are separated between the memory array chip stacks 120. In detail, the first dielectric layer 160 and the carrier 170 between the memory array chip stacks 120 are vertically cut, such that a carrier 170 with one memory array chip stack 120 disposed thereon is obtained.

Figure 5A:
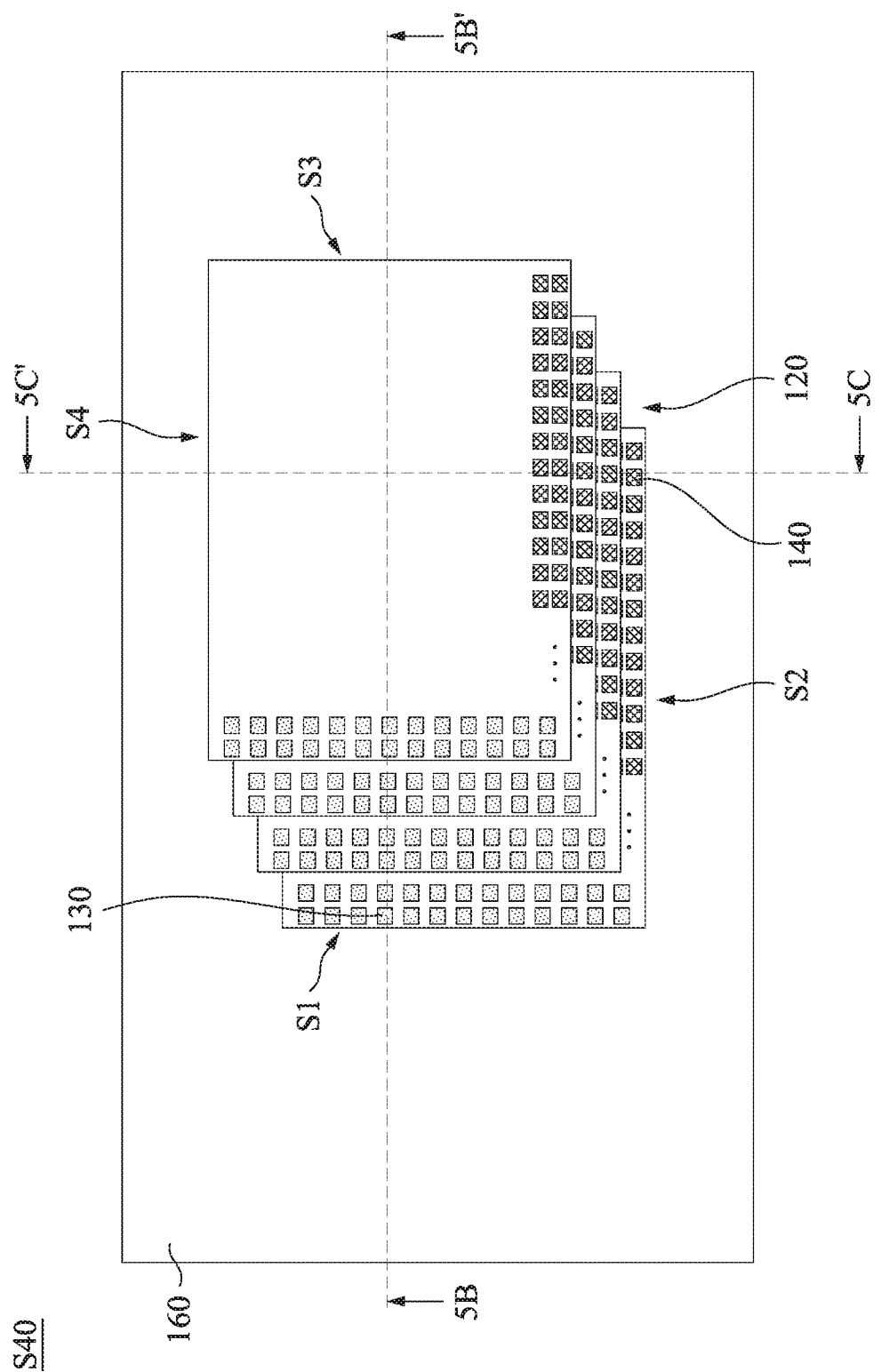
Figure 5B:
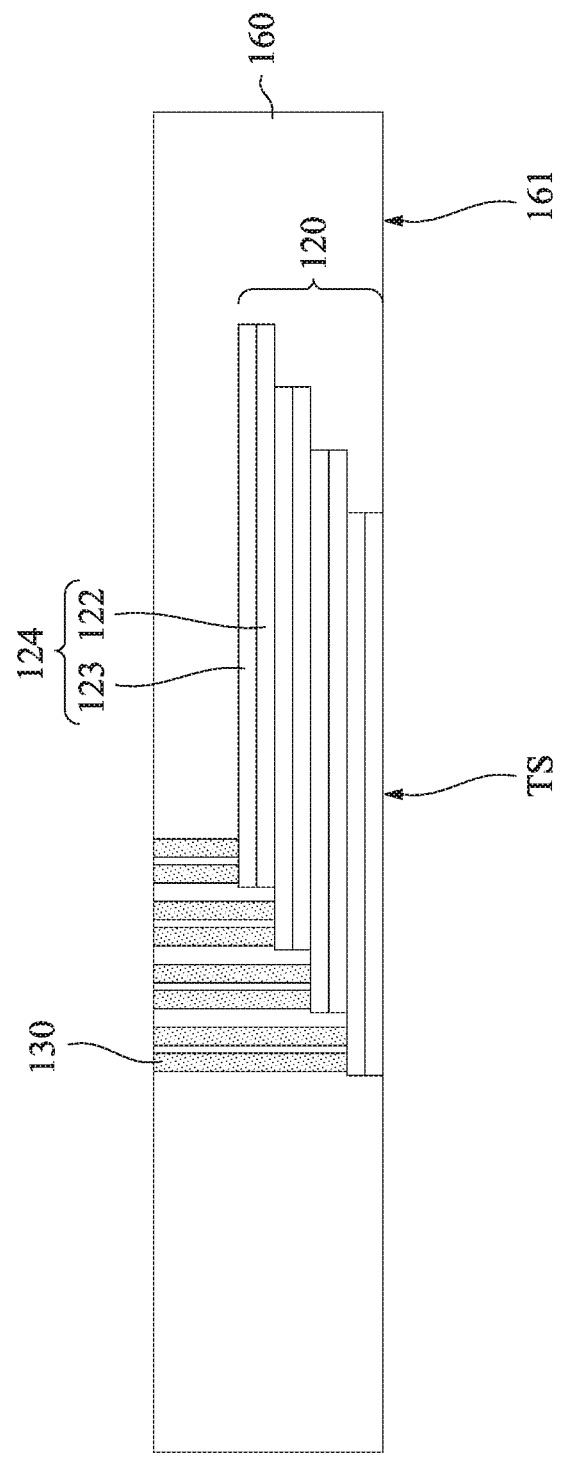
Figure 5C:
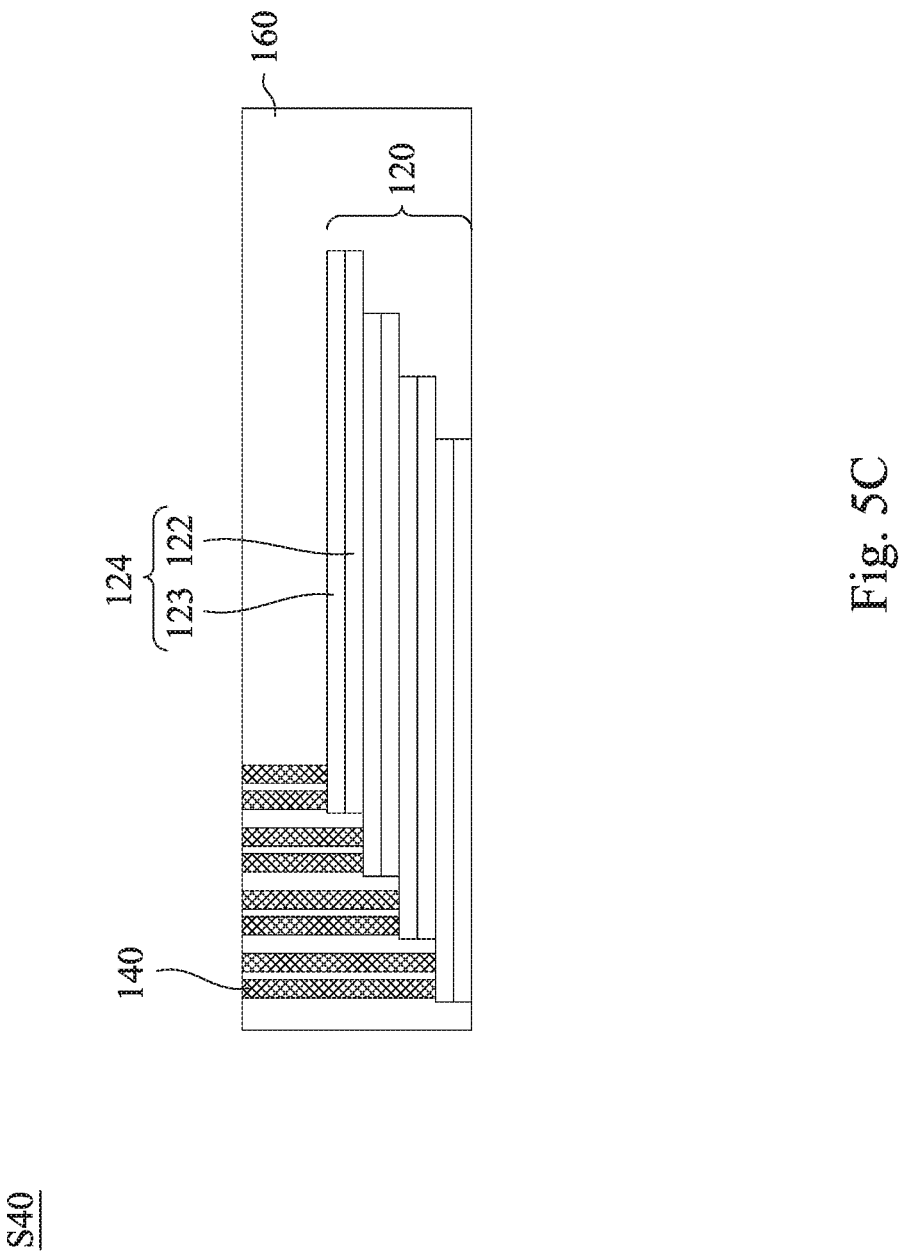

Reference is made to FIG. 5A to FIG. 5C, in which FIG. 5B is a cross-sectional view taken along line 5B-5B' shown in FIG. 5A, and FIG. 5B is a cross-sectional view taken along line 5C-5C' shown in FIG. 5A. In step S40, the carrier 170 (see FIG. 4B) is de-bonded from memory array chip stack 120 and the first dielectric layer 160, such that a bottom surface 161 of the first dielectric layer 160 (which will be the top surface 161 of the first dielectric layer 160 after the memory device 100 is formed) and a bottom surface TS of the memory array chip stack 120 (which will be the top surface TS of the memory array chip stack 120 after the memory device 100 is formed) are exposed. In some embodiments, step S40 may be selectively performed, which will be discussed later in the following descriptions.

Figure 6A:
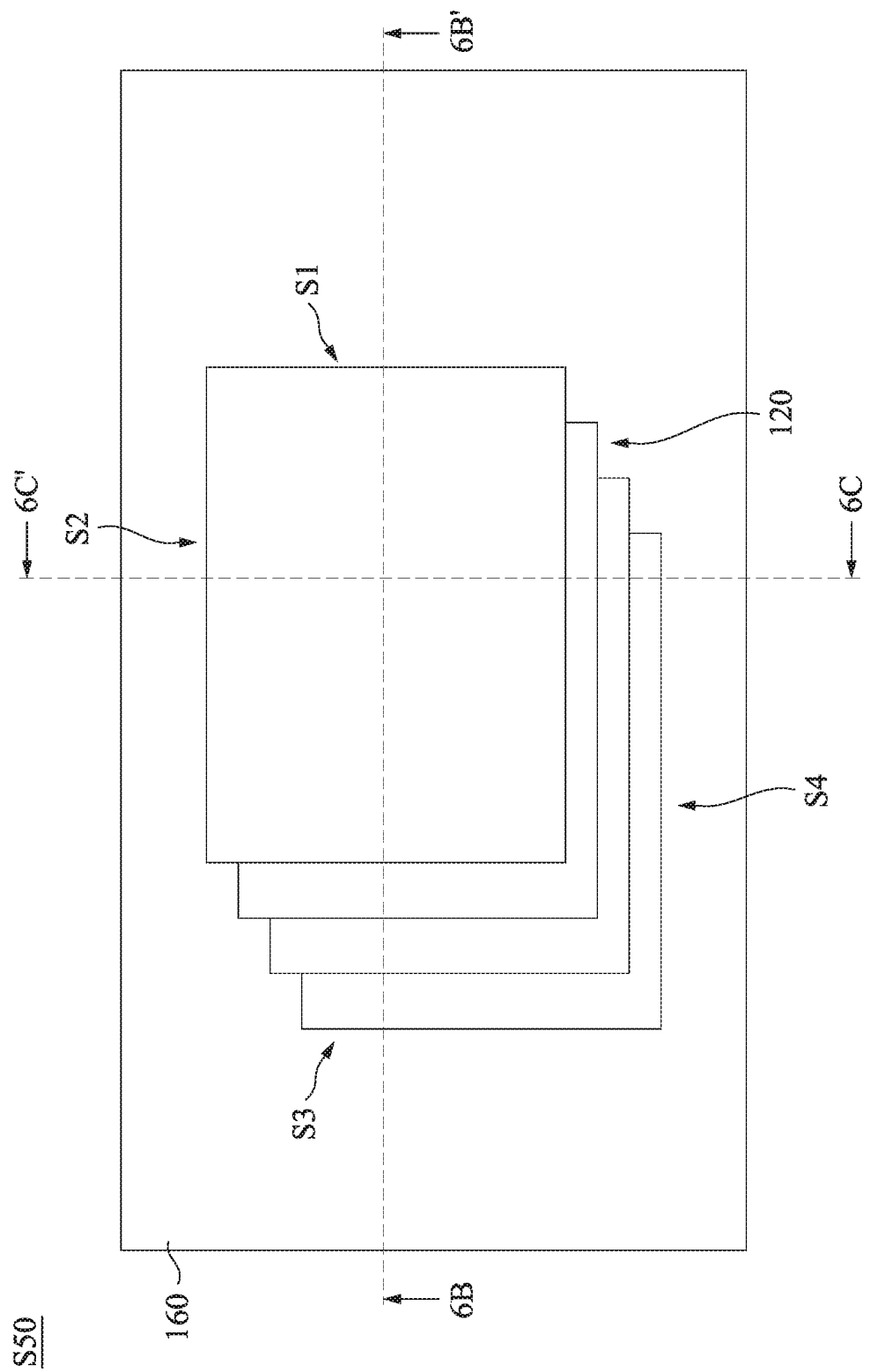
Figure 6B:
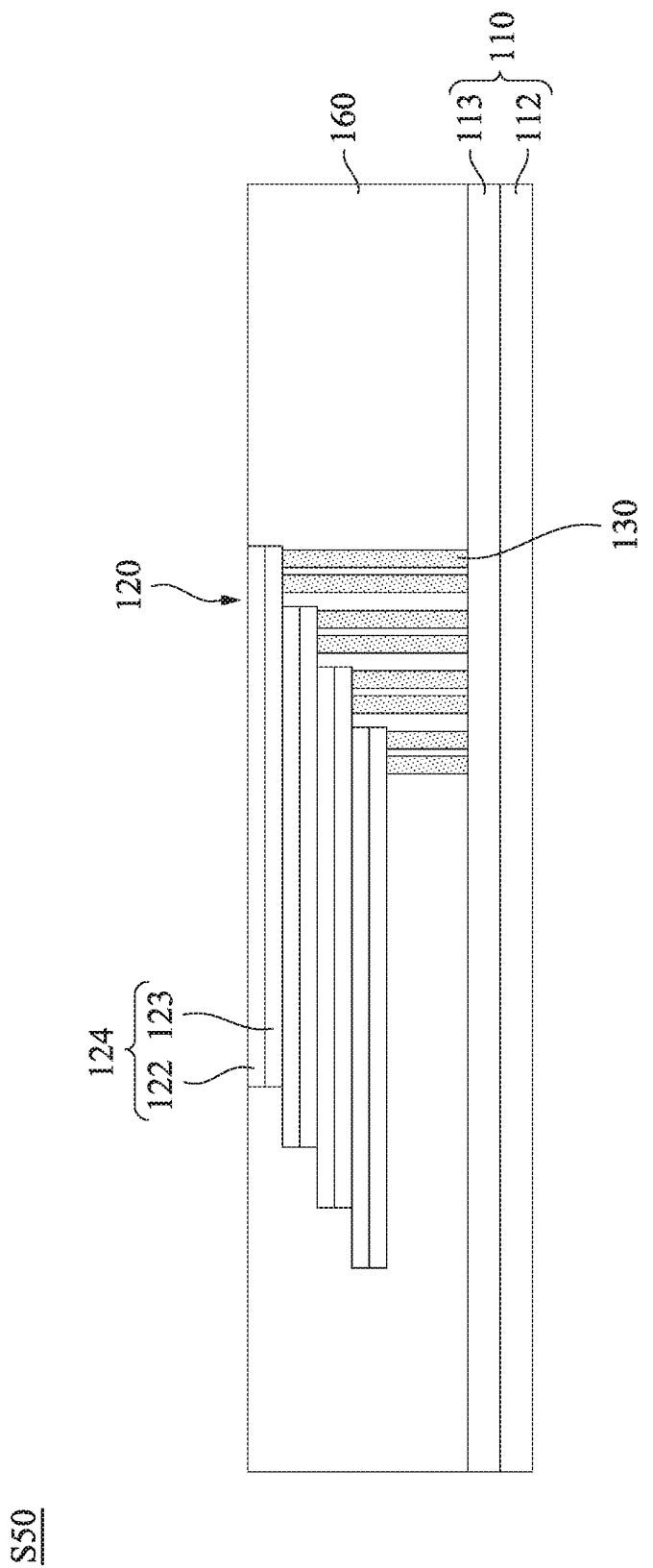
Figure 6C:
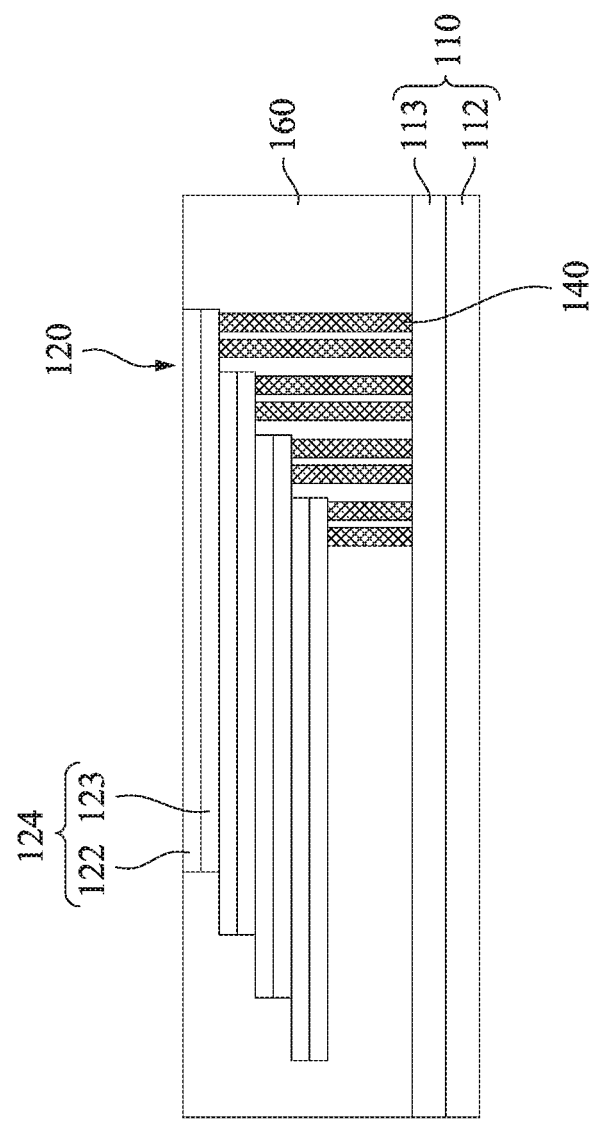

Reference is made to FIG. 6A to FIG. 6C, in which FIG. 6B is a cross-sectional view taken along line 6B-6B' shown in FIG. 6A, and FIG. 6B is a cross-sectional view taken along line 6C-6C' shown in FIG. 6A. In step S50, the periphery wafer 110 is provided, and the structure shown in FIG. 5A to FIG. 5C are then placed up-side-down (i.e., in an inverted manner) on the functional surface 113 of the periphery wafer 110, so as to undergo a face-to-face bonding (i.e., the functional surface 113 of the periphery wafer 110 faces toward the functional surface of the memory array chip stack 120). In some embodiments, conductive pads (not shown) may be formed on the functional surface 113 of the periphery wafer 110 in advance, such that the first conductive contacts 130 and the second conductive contacts 140 can be formed directly on the conductive pads to make electrical connections. In some embodiments, the conductive pads may include copper, gold, or other suitable conductive metal materials. In preferred embodiments, the conductive pads, the first conductive contacts 130, and the second conductive contacts 140 may include the same material.

During the bonding process, the conductive metal materials at the connecting points of the conductive pads and the first conductive contacts 130 and the connecting points of the conductive pads and the second conductive contacts 140 may diffuse due to a relatively high temperature and pressure (comparing to normal temperature and pressure, NTP). Such diffusion may lead to interconnections between the conductive pads and the first conductive contacts 130 and between the conductive pads and the second conductive contacts 140. In some embodiments, the conductive pads and the first conductive contacts 130 are formed as a single piece without an interface therebetween after the bonding process. Similarly, the conductive pads and the second conductive contacts 140 are formed as a single piece without an interface therebetween after the bonding process. Since such a bonding process is a solderless process, the length L1, L2 and the width W1, W2 (see FIG. 3A) of each of the first conductive contacts 130 and the second conductive contacts 140 can be small (i.e., in a range from about 0.1 µm to about 2 µm), thus providing a small resistance for the current passing therethrough.

Figure 7A:
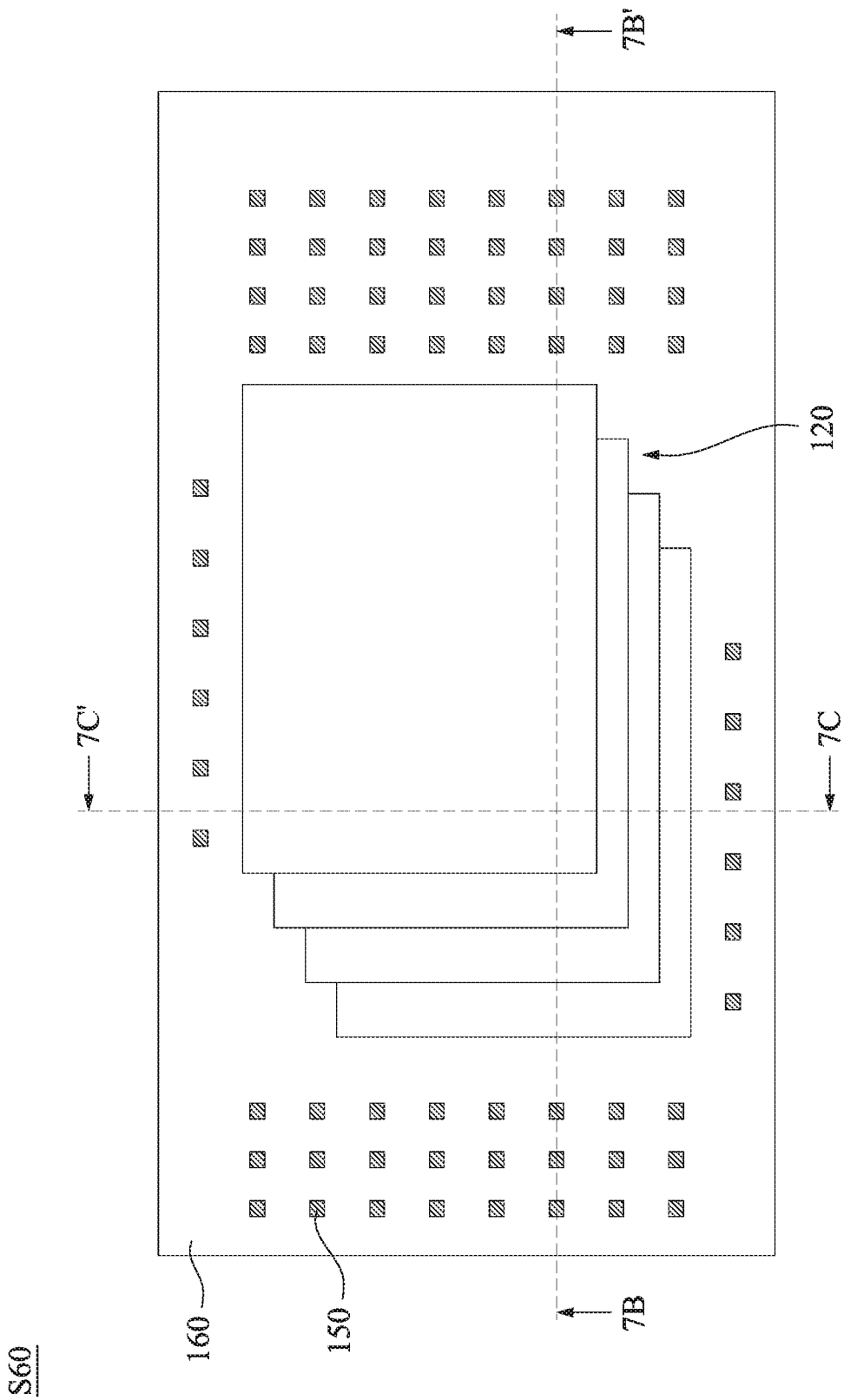
Figure 7B:
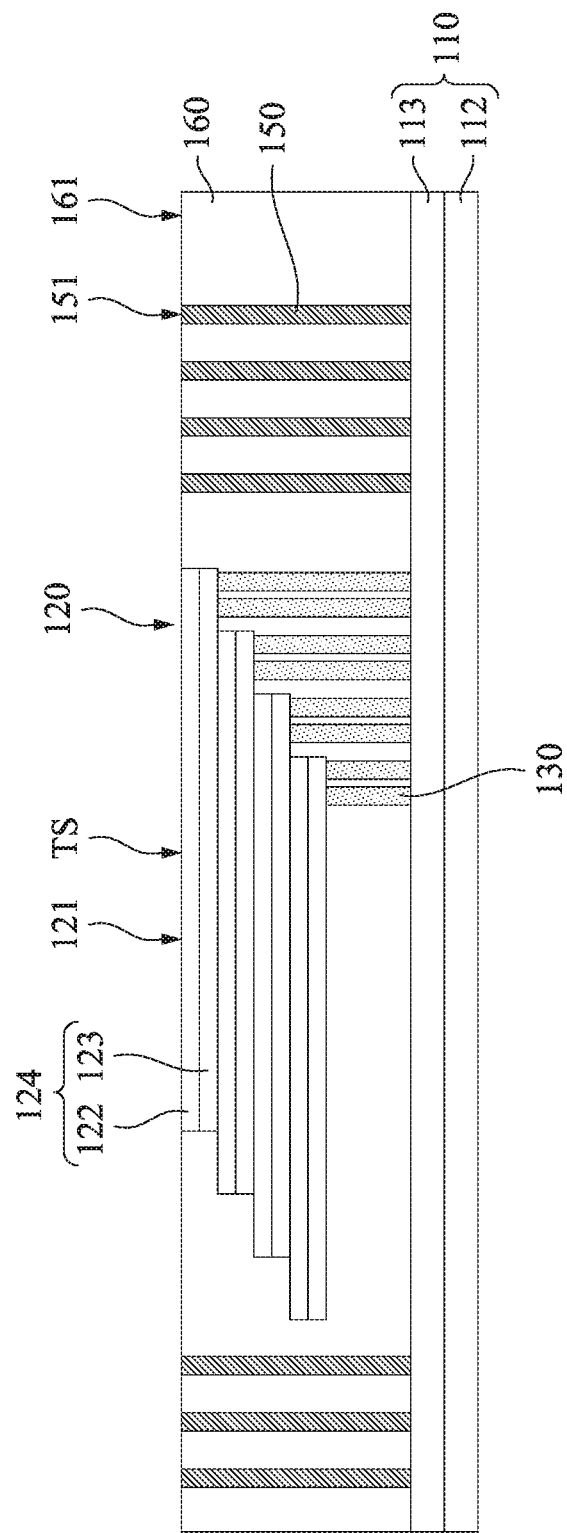
Figure 7C:
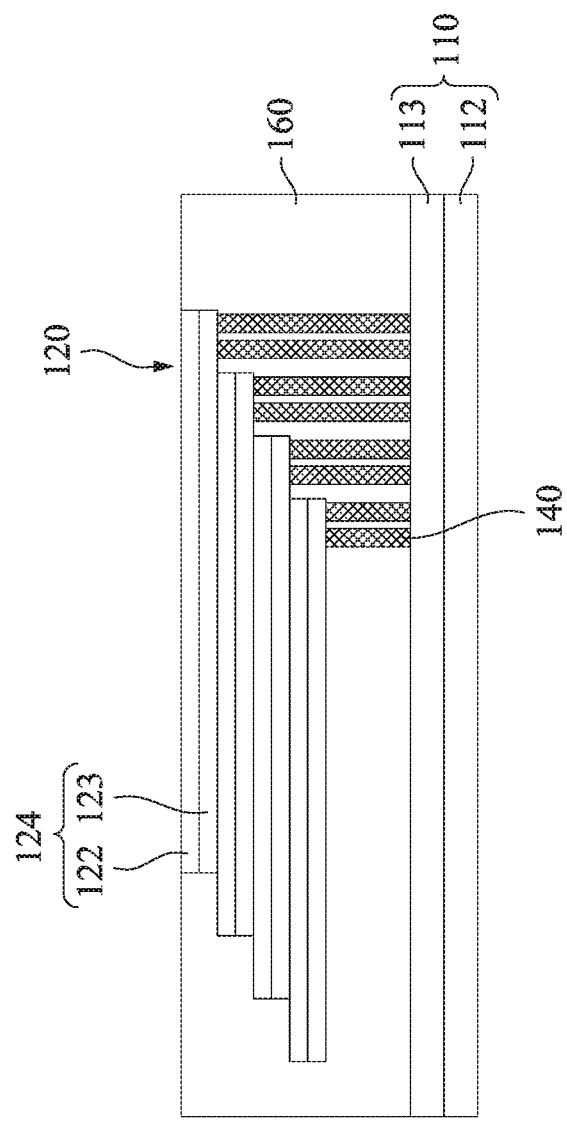

Reference is made to FIG. 7A to FIG. 7C, in which FIG. 7B is a cross-sectional view taken along line 7B-7B' shown in FIG. 7A, and FIG. 7B is a cross-sectional view taken along line 7C-7C' shown in FIG. 7A. In step S60, the third conductive contacts 150 are formed within the first dielectric layer 160 and on portions of the functional surface 113 of the periphery wafer 110. In some embodiments, the third conductive contacts 150 are formed by removing portions of the first dielectric layer 160 to form recesses R exposing portions of the functional surface 113 of the periphery wafer 110 followed by filling a conductive material in the recess R. In some embodiments, the removal of the portions of the first dielectric layer 160 may be performed by a dry or wet etching process. In some embodiments, a hard mask (not shown) may be formed over portions of the first dielectric layer 160 during the etching process, so as to remove the exposed portions of the first dielectric layer 160 not being covered by the hard mask. In addition, a planarization process, such as a CMP process, may be performed to remove excess portions of the conductive material and the first dielectric layer 160, such that the top surface 161 of the first dielectric layer 160 is substantially coplanar with the top surface TS of the memory array chip stack 120 (i.e., the non-functional surface 121 of the topmost memory array chip 124) and the top surface 151 of the third conductive contacts 150. After step S60, the memory device 100 shown in FIG. 1A to FIG. 1C is formed.

Figure 8:
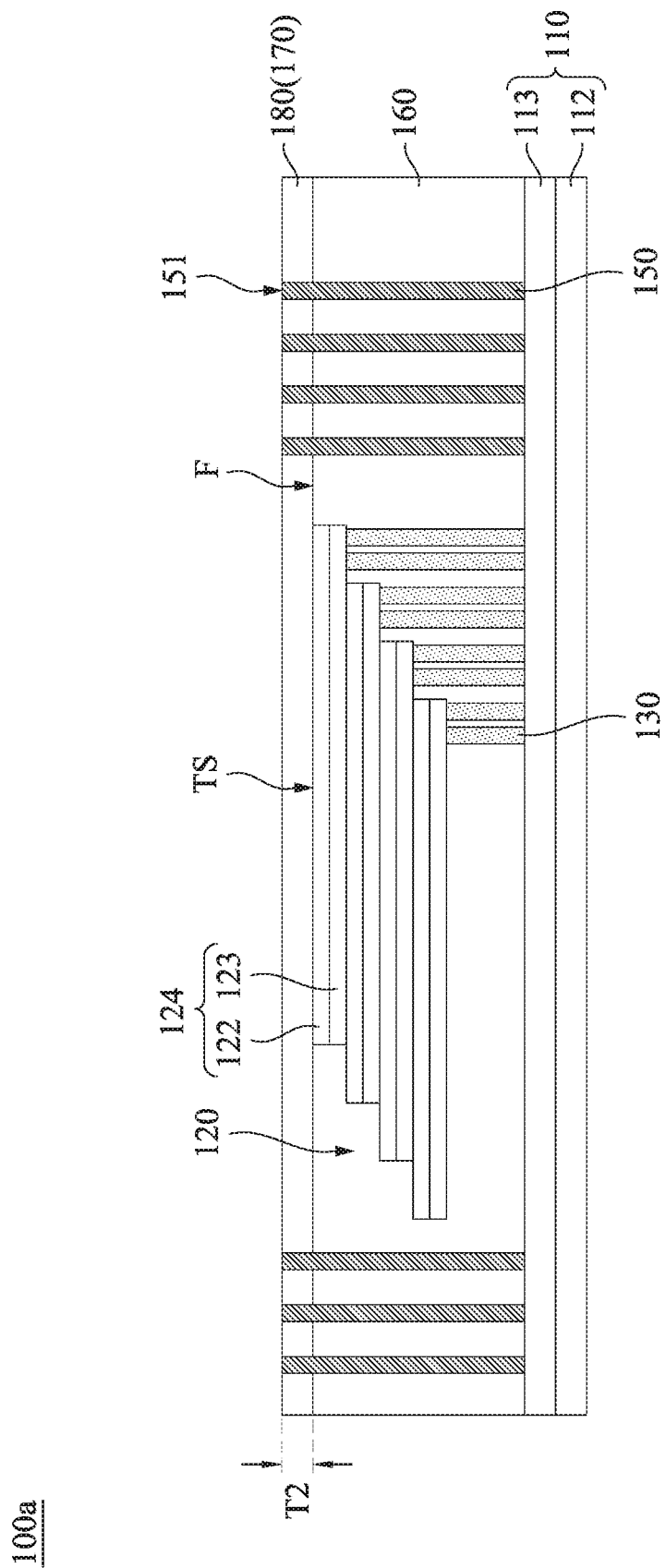
FIGS. 8-10 are cross-sectional views illustrating memory devices according to some other embodiments of the present disclosure.

FIG. 8 is a cross-sectional views illustrating memory device 100a according to some other embodiments of the present disclosure. At least one difference between the memory device 100a shown in FIG. 8 and the memory device 100 shown in FIG. 1B is that the memory device 100a further includes a second dielectric layer 180 laterally extending over the first dielectric layer 160 and covering the memory array chip stack 120. In some embodiments, the third conductive contacts 150 may further penetrate through the second dielectric layer 180, such that the top surfaces 151 of the third conductive contacts 150 are higher than the top surface TS of the memory array chip stack 120, and the top surfaces 151 of the third conductive contacts 150 are further exposed by the second dielectric layer 180. In some embodiments, the second dielectric layer 180 may include organic materials such as polyimide. In alternative embodiments, the second dielectric layer 180 may include inorganic materials such as silicon dioxide formed as spin-on glass. In detail, when the second dielectric layer 180 includes a material different from that of the first dielectric layer 160, an interface F may be observed between the first dielectric layer 160 and the second dielectric layer 180; and when the second dielectric layer 180 includes a material substantially identical to that of the first dielectric layer 160, no interface F is observed between the first dielectric layer 160 and the second dielectric layer 180, that is, the first dielectric layer 160 and the second dielectric layer 180 are formed as a single piece without an interface F therebetween. However, when the memory device 100 is dipped in some acidic solutions (e.g., HF solutions), an interface F may still be observed even when the first dielectric layer 160 and the second dielectric layer 180 include the same material.

In some embodiments, the second dielectric layer 180 may be formed before the third conductive contacts 150 are formed and after the face-to-face bonding process is performed. In alternative embodiments, the second dielectric layer 180 may be the carrier 170 (see FIG. 2B) mentioned above in step S10. In detail, as mentioned above in step S40, the process of de-bonding the carrier 170 may be selectively performed, and when the carrier 170 is not being de-bonded in step S40, the carrier 170 may be preserved to serve as the second dielectric layer 180 herein. In this case, the second dielectric layer 180 may include the material of the carrier 170, such as silicon dioxide. Since the carrier 170 may be preserved before the face-to-face bonding process, the convenience for placing the structure shown in FIG. 5A to FIG. 5C up-side-down on the functional surface 113 of the periphery wafer 110 can be enhanced accordingly.

Figure 9:
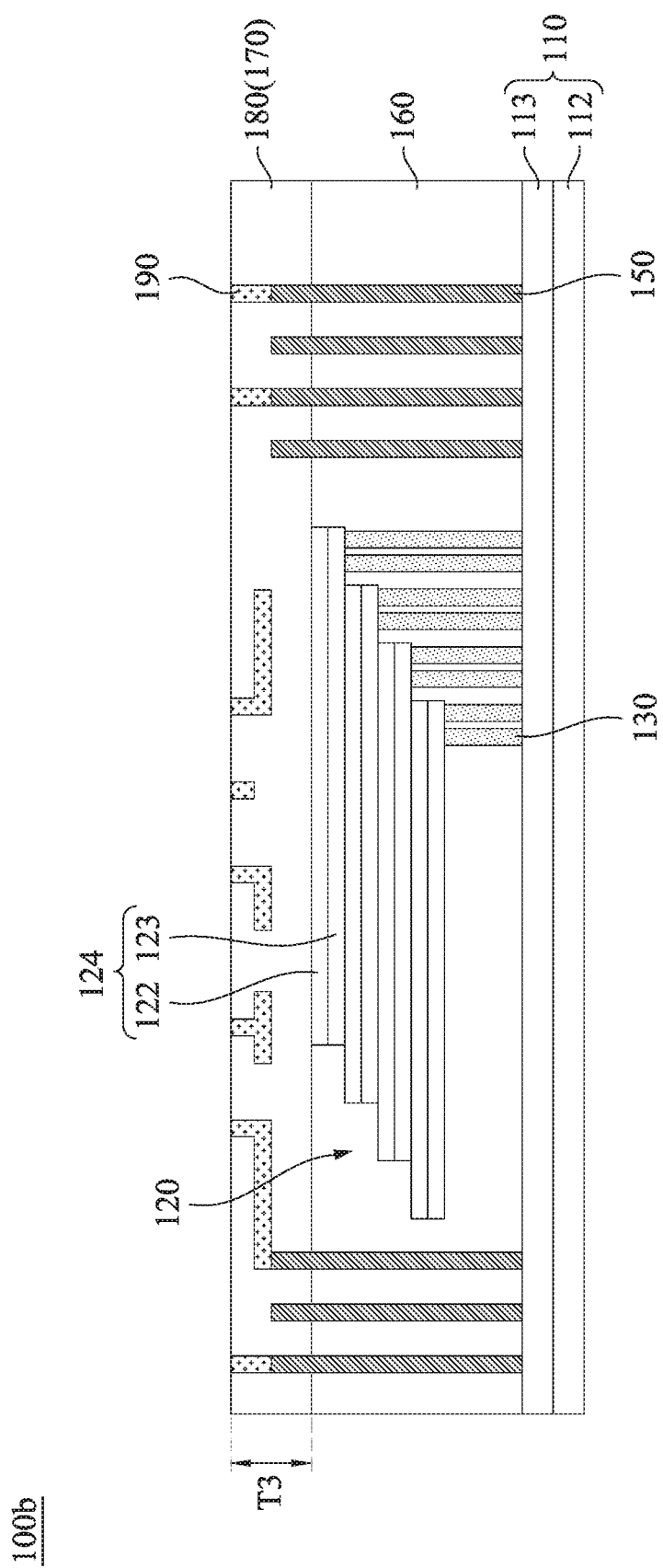

FIG. 9 is a cross-sectional views illustrating memory device 100b according to some other embodiments of the present disclosure. At least one difference between the memory device 100b shown in FIG. 9 and the memory device 100a shown in FIG. 8 is that the memory device 100b further includes a plurality of redistribution layers (RDLs) 190 within the second dielectric layer 180 and connecting to the third conductive contacts 150. In some embodiments, the redistribution layers 190 may include copper, gold, or other suitable conductive metal materials. In some embodiments, a thickness T3 of the second dielectric layer 180 in the memory device 100b is larger than a thickness T2 of the second dielectric layer 180 in the memory device 100a, so as to preserve spaces for the formation of the redistribution layers 190.

Figure 10:
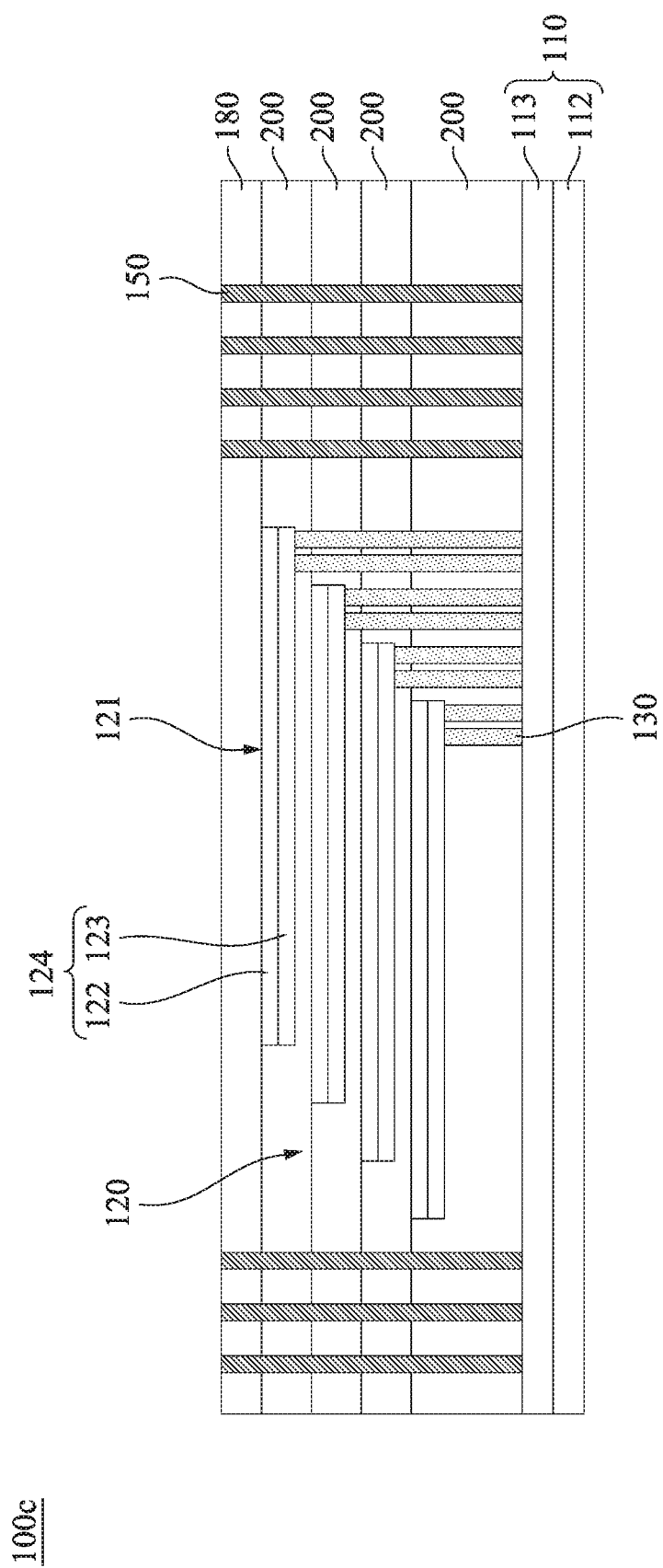

FIG. 10 is a cross-sectional views illustrating memory device 100c according to some other embodiments of the present disclosure. At least one difference between the memory device 100c shown in FIG. 10 and the memory device 100a shown in FIG. 8 is that the memory device 100c includes a plurality of dielectric layers 200 laterally extending and being stacked above the periphery wafer 110, instead of one dielectric layer (i.e., the first dielectric layer 160) above the periphery wafer 110. In addition, the dielectric layers 200 surround the memory array chip stack 120, the first conductive contacts 130, the second conductive contacts 140 (not shown), and the third conductive contacts 150. In some embodiments, the dielectric layers 200 may further laterally interpose between the memory array chips 124. In other words, the adjacent memory array chips 124 may be separated by the dielectric layers 200. For example, the dielectric layer 200 interposed between the topmost memory array chip 124 and the second topmost memory array chip 124 may be directly in contact with the functional surface 123 of the topmost memory array chip 124 and the non-functional surface 121 of the second topmost memory array chip 124. In some embodiments, the dielectric layers 200 may include organic materials such as polyimide. In alternative embodiments, the dielectric layers 200 may include inorganic materials such as silicon dioxide formed as spin-on glass. In some embodiments, each of the dielectric layers 200 may include the same material. In other embodiments, each of the dielectric layers 200 may include different materials. In alternative embodiments, the adjacent dielectric layers 200 may include different materials.

According to the aforementioned embodiments of the present disclosure, since at least one side of the memory array chip stack is in a staircase configuration, a large number of the conductive contacts can be formed on the side and between the periphery wafer and the memory array chip stack. Therefore, a high-density and high-speed memory device can be formed accordingly. In addition, since the memory array chip stack is disposed on the periphery wafer instead of being laterally adjacent the periphery wafer, the conductive patterns on the memory array chip stack and the conductive patterns on the periphery wafer can be manufactured separately. Accordingly, the optimized conditions of the manufacturing process (e.g., the thermal cycle) can be tuned respectively for the memory array chip stack and the periphery wafer, such that the manufacturing process for the memory array chip stack and the periphery wafer may not interference with each other. Furthermore, since the size of the periphery wafer is larger than the size of the memory array chip stack, there is no need for a precise alignment during the face-to-face bonding of the memory array chip stack to the periphery wafer, and hence the cost of alignment can be saved. In addition, one stack volatile working memory (DRAM or SRAM) chip with the controller under the stack can achieve high-bandwidth-memory (HBM) and high speed read/write capability, and the present disclosure which adopt the through-dielectric-via rather than through-silicon-via will bring benefit from low cost. Input/output (I/O) numbers could be equal to or over 1024 for one stack working volatile memory (DRAM or SRAM) stack.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A memory device, comprising:
   a periphery wafer having a functional surface;
   a memory array chip stack disposed on the periphery wafer and having a functional surface, wherein the functional surface of the periphery wafer faces toward the functional surface of the memory array chip stack, and a first side of the memory array chip stack is in a staircase configuration;
   a plurality of first conductive contacts on the first side of the memory array chip stack, and between and interconnecting the functional surface of the periphery wafer and the functional surface of the memory array chip stack; and
   a plurality of third conductive contacts on the functional surface of the periphery wafer and surrounding the memory array chip stack, wherein a top surface of each of the third conductive contacts that is facing away from the functional surface of the periphery wafer is higher than a top surface of the memory array chip stack that is facing away from the functional surface of the memory array chip stack.

2. The memory device of claim 1, wherein a second side of the memory array chip stack is in a staircase configuration, and the second side is adjacent the first side of the memory array chip stack.

3. The memory device of claim 2, further comprising a plurality of second conductive contacts on the second side of the memory array chip stack, and between and interconnecting the functional surface of the periphery wafer and the functional surface of the memory array chip stack.

4. The memory device of claim 3, wherein a total number of the first conductive contacts and the second conductive contacts is in a range from about 100,000 to about 100,000,000.

5. The memory device of claim 2, wherein a third side opposite to the first side of the memory array chip stack is in an inverted staircase configuration.

6. The memory device of claim 1, wherein the memory array chip stack comprises a plurality of memory array chips vertically stacked in a face-to-bottom manner.

7. The memory device of claim 6, wherein the memory array chip stack comprises at least four of the memory array chips.

8. The memory device of claim 6, wherein a thickness of each of the memory array chips is in a range from about 1 μm to about 50 μm.

9. The memory device of claim 6, wherein the memory array chips are of a same size.

10. The memory device of claim 6, further comprising a plurality of dielectric layers laterally interposed between the memory array chips.

11. The memory device of claim 6, wherein each of the memory array chips is exposed by the adjacent one of the memory array chips at the first side of the memory array chip stack by the same interval.

12. The memory device of claim 1, wherein a length and a width of the periphery wafer are respectively larger than a length and a width of the memory array chip stack.

13. The memory device of claim 1, wherein a length and a width of each of the first conductive contacts are in a range from about 0.1 μm to about 2 μm.

14. The memory device of claim 1, further comprising a first dielectric layer laterally extending over the periphery wafer and surrounding the memory array chip stack and the first conductive contacts.

15. The memory device of claim 14, further comprising a second dielectric layer laterally extending over the first dielectric layer and covering the memory array chip stack.

16. The memory device of claim 15, wherein an interface is between the first dielectric layer and the second dielectric layer.

17. The memory device of claim 14, wherein the first dielectric layer further covers the memory array chip stack.

18. The memory device of claim 1, wherein a fourth side opposite to the second side of the memory array chip stack is in an inverted staircase configuration.

* * * * *